US012740261B2

(12) United States Patent
Zhang et al.

(10) Patent No.: US 12,740,261 B2
(45) Date of Patent: Sep. 15, 2026

(54) DISPLAY SUBSTRATE AND PREPARATION METHOD THEREFOR, AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Tiaomei Zhang, Beijing (CN); Wenbo Chen, Beijing (CN); Quanyong Gu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 613 days.

(21) Appl. No.: 18/027,127

(22) PCT Filed: Apr. 25, 2022

(86) PCT No.: PCT/CN2022/088977
§ 371 (c)(1),
(2) Date: Mar. 20, 2023

(87) PCT Pub. No.: WO2023/205997
PCT Pub. Date: Nov. 2, 2023

(65) Prior Publication Data
US 2024/0324333 A1 Sep. 26, 2024

(51) Int. Cl.
*H10K 59/88* (2023.01)
*H10K 59/12* (2023.01)
*H10K 59/131* (2023.01)

(52) U.S. Cl.
CPC ....... *H10K 59/131* (2023.02); *H10K 59/1201* (2023.02); *H10K 59/88* (2023.02)

(58) Field of Classification Search
CPC ........ H10K 59/351–353; H10K 59/1201–121; H10K 59/88
See application file for complete search history.

(56) References Cited

U.S. PATENT DOCUMENTS

2003/0030766 A1* 2/2003 Kiguchi ................ G02B 5/201 349/106
2020/0357867 A1 11/2020 Song et al.
(Continued)

FOREIGN PATENT DOCUMENTS

CN 107479766 A 12/2017
CN 113471257 A 10/2021
(Continued)

OTHER PUBLICATIONS

Office Action dated Nov. 25, 2022 for Chinese Patent Application No. 2022800008701 and English Translation.

*Primary Examiner* — Eric K Ashbahian

(57) ABSTRACT

Disclosed are a display substrate and a preparation method therefor, and a display apparatus. The display substrate includes multiple circuit units constituting multiple unit rows and multiple unit columns, and multiple dummy units constituting at least one dummy row and/or at least one dummy column. The dummy row includes multiple dummy units sequentially arranged along a first direction. The dummy column includes multiple dummy units sequentially arranged along a second direction; at least one unit column is provided with a first initial signal line, at least one dummy row is provided with a first connection line, and the first initial signal line is connected with the first connection line; and/or, at least one unit row is provided with a second initial signal line, at least one dummy column is provided with a second connection line (80), and the second initial signal line is connected with the second connection line.

20 Claims, 21 Drawing Sheets

(56) References Cited

U.S. PATENT DOCUMENTS

| | | | | |
|---|---|---|---|---|
| 2021/0057494 | A1* | 2/2021 | Chung | H10K 59/353 |
| 2022/0376024 | A1 | 11/2022 | Zheng et al. | |
| 2023/0005986 | A1* | 1/2023 | Kang | H10H 29/142 |
| 2023/0021680 | A1 | 1/2023 | Hefei et al. | |
| 2023/0343298 | A1* | 10/2023 | Matsueda | G09G 3/3233 |
| 2024/0029648 | A1* | 1/2024 | Lou | H10K 59/123 |
| 2025/0040380 | A1* | 1/2025 | Liu | H10K 59/131 |

FOREIGN PATENT DOCUMENTS

| | | | |
|---|---|---|---|
| CN | 114120905 | A | 3/2022 |
| CN | 114373774 | A | 4/2022 |
| CN | 116097442 | A | 5/2023 |
| CN | 116686414 | A | 9/2023 |
| JP | 2006-171033 | A | 6/2006 |
| WO | 2022057491 | A1 | 3/2022 |
| WO | 2022062465 | A1 | 3/2022 |

* cited by examiner

Pxij
300
100
200

VDD
C
T5
E
N1
T4
D
N2
T3
S1
T2
N3
T6
E
S2
T1
S1
T7
INIT2
INIT1
OLED
S2
VSS

DISPLAY SUBSTRATE AND PREPARATION METHOD THEREFOR, AND DISPLAY APPARATUS

CROSS-REFERENCE TO RELATED APPLICATION

The present application is a U.S. National Phase Entry of International Application No. PCT/CN2022/088977 having an international filing date of Apr. 25, 2022. The entire contents of the above-identified application are hereby incorporated by reference.

TECHNICAL FIELD

The present disclosure relates to, but is not limited to, the field of display technologies, and particularly to a display substrate and a preparation method therefor, and a display apparatus.

BACKGROUND

An Organic Light Emitting Diode (OLED for short) and a Quantum dot Light Emitting Diode (QLED for short) are active light emitting display devices and have advantages such as self-luminescence, a wide viewing angle, a high contrast ratio, low power consumption, an extremely high response speed, lightness and thinness, flexibility, and a low cost. With constant development of display technologies, a flexible display apparatus (Flexible Display) in which an OLED or a QLED is used as a light emitting device and signal control is performed through a thin film transistor (TFT for short) has become a mainstream product in the field of display at present.

SUMMARY

The following is a summary of subject matters described herein in detail. The summary is not intended to limit the protection scope of claims.

In one aspect, the present disclosure provides a display substrate, the display substrate includes a display region, a bonding region disposed on a side of the display region, and a bezel region disposed on another side of the display region, the display region includes: multiple circuit units constituting multiple unit rows and multiple unit columns, and multiple dummy units constituting at least one dummy row and/or at least one dummy column, the dummy row includes multiple dummy units sequentially arranged along a first direction, the dummy column includes multiple dummy units sequentially arranged along a second direction, the first direction intersects with the second direction; at least one unit column is provided with a first initial signal line extending along the second direction, and at least one dummy row is provided with a first connection line extending along the first direction, the first initial signal line is connected with the first connection line to form a mesh structure for transmitting a first initial signal; and/or, at least one unit row is provided with a second initial signal line extending along the first direction, and at least one dummy column is provided with a second connection line extending along the second direction, and the second initial signal line is connected with the second connection line to form a mesh structure for transmitting a second initial signal.

In an exemplary implementation mode, at least one dummy unit in the dummy row includes a first initial electrode, a first end of the first initial electrode is connected with the first initial signal line, and a second end of the first initial electrode is connected with the first connection line.

In an exemplary implementation mode, at least one dummy unit in the dummy column includes a second initial electrode, a first end of the second initial electrode is connected with the second connection line, and a second end of the second initial electrode is connected with the second initial signal line.

In an exemplary implementation mode, at least one dummy unit in the dummy row includes a first initial electrode, a first end of the first initial electrode is connected with the first initial signal line, and a second end of the first initial electrode is connected with the first connection line; at least one dummy unit in the dummy column includes a second initial electrode, a first end of the second initial electrode is connected with the second connection line, and a second end of the second initial electrode is connected with the second initial signal line.

In an exemplary implementation mode, at least one circuit unit includes a pixel drive circuit, the pixel drive circuit at least includes a storage capacitor and multiple transistors; in a plane perpendicular to the display substrate, the display substrate includes a semiconductor layer, a first conductive layer, a second conductive layer, and a third conductive layer sequentially arranged on a base substrate, the semiconductor layer at least includes active layers of the multiple transistors, the first conductive layer at least includes a first electrode plate of the storage capacitor and gate electrodes of the multiple transistors, the second conductive layer at least includes a second electrode plate of the storage capacitor and the second initial signal line, and the third conductive layer at least includes the first initial signal line and first electrodes and second electrodes of the multiple transistors.

In an exemplary implementation mode, the second conductive layer further includes the first connection line, the third conductive layer further includes a first initial electrode, a first end of the first initial electrode is connected with the first initial signal line, and a second end of the first initial electrode is connected with the first connection line through a via.

In an exemplary implementation mode, the third conductive layer further includes a second initial electrode and the second connection line, a first end of the second initial electrode is connected with the second connection line, and a second end of the second initial electrode is connected with the second initial signal line through a via.

In an exemplary implementation mode, the second conductive layer further includes the first connection line, the third conductive layer further includes a first initial electrode, a second initial electrode, and the second connection line, a first end of the first initial electrode is connected with the first initial signal line, a second end of the first initial electrode is connected with the first connection line through a via, a first end of the second initial electrode is connected with the second connection line, and a second end of the second initial electrode is connected with the second initial signal line through a via.

In an exemplary implementation mode, the multiple transistors include a first transistor, a second transistor, a third transistor, a fourth transistor, a fifth transistor, a sixth transistor, and a seventh transistor; a first electrode of the first transistor is connected with the first initial signal line, a first electrode of the fourth transistor is connected with a data signal line, a first electrode of the fifth transistor is connected with a first power supply line, a first electrode of the seventh transistor is connected with the second initial signal line, a second electrode of the first transistor is connected with a first electrode of the second transistor and a gate electrode of the third transistor, a second electrode of the second transistor is connected with a second electrode of the third transistor and a first electrode of the sixth transistor, a first electrode of the third transistor is connected with a second electrode of the fourth transistor and a second electrode of the fifth transistor, and a second electrode of the sixth transistor is connected with a second electrode of the seventh transistor.

In an exemplary implementation mode, the pixel drive circuit further includes an anode connection electrode, the anode connection electrode is connected with the second electrode of the sixth transistor and the second electrode of the seventh transistor respectively, and an orthographic projection of the anode connection electrode on the base substrate is at least partially overlapped with an orthographic projection of the first initial signal line on the base substrate.

In an exemplary implementation mode, the anode connection electrode includes a first electrode, a second electrode, and a third electrode, a first end of the first electrode is connected with the second electrode of the sixth transistor through a via, after a second end of the first electrode extends along an opposite direction of the first direction, the second end of the first electrode is connected with a first end of the second electrode, after a second end of the second electrode extends along an opposite direction of the second direction, the second end of the second electrode is connected with a first end of the third electrode, after a second end of the third electrode extends along the first direction, the second end of the third electrode is connected with the second electrode of the seventh transistor through a via, and an orthographic projection of the second electrode on the base substrate is at least partially overlapped with the orthographic projection of the first initial signal line on the base substrate.

In an exemplary implementation mode, the pixel drive circuit further includes a shielding electrode, the shielding electrode is connected with the first power supply line, and an orthographic projection of the shielding electrode on the base substrate is at least partially overlapped with an orthographic projection of the second electrode of the first transistor on the base substrate.

In an exemplary implementation mode, at least one dummy unit includes a dummy drive circuit, the dummy drive circuit at least includes a storage capacitor and a first transistor to a seventh transistor, the storage capacitor includes a first electrode plate and a second electrode plate, an orthographic projection of the first electrode plate on the base substrate is at least partially overlapped with an orthographic projection of the second electrode plate on the base substrate, and the first electrode plate of the dummy drive circuit and the second electrode plate of the dummy drive circuit are both connected with the first power supply line.

In an exemplary implementation mode, an active layer of the first transistor in the dummy drive circuit lacks a channel region and an active layer of the seventh transistor in the dummy drive circuit lacks a channel region.

In an exemplary implementation mode, the display region at least includes a first circuit region, a second circuit region, and a third circuit region; the first circuit region includes multiple unit rows, multiple unit columns, at least one dummy row, and at least one dummy column, the second circuit region is disposed between the first circuit region and the bezel region, the second circuit region includes a gate drive circuit, multiple unit rows, multiple unit columns, and at least one dummy row, the third circuit region is disposed between the first circuit region and the bonding region, and the third circuit region includes a data fan-out line, multiple unit rows, multiple unit columns, and at least one dummy column.

In an exemplary implementation mode, at least one dummy unit in the dummy row at least includes a dummy drive circuit, the dummy drive circuit is connected with a first scan signal line, a second scan signal line, and a light emitting control line, the first scan signal line, the second scan signal line, and the light emitting control line in the dummy row extend to the bezel region along the first direction and are connected with a bezel power supply lead line in the bezel region, and the bezel power supply lead line is configured to transmit a high voltage power supply signal or a low voltage power supply signal.

In an exemplary implementation mode, at least one dummy unit in the dummy column at least includes a dummy drive circuit, the dummy drive circuit is connected with a data signal line, the data signal line in the dummy column extends to the bonding region along the second direction, and the data signal line is connected with a bonding power supply lead line in the bonding region, and the bonding power supply lead line is configured to transmit a high voltage power supply signal or a low voltage power supply signal.

In another aspect, the present disclosure further provides a display apparatus, including the aforementioned display substrate.

In yet another aspect, the present disclosure further provides a preparation method of a display substrate. The display substrate includes a display region, a bonding region disposed on a side of the display region, and a bezel region disposed on another side of the display region, the display region includes: multiple circuit units constituting multiple unit rows and multiple unit columns, and multiple dummy units constituting at least one dummy row and/or at least one dummy column, the dummy row includes multiple dummy units sequentially arranged along a first direction, the dummy column includes multiple dummy units sequentially arranged along a second direction, the first direction intersects with the second direction; the preparation method includes: forming a first initial signal line extending along the second direction in at least one unit column, forming a first connection line extending along the first direction in at least one dummy row, wherein the first initial signal line is connected with the first connection line to form a mesh structure for transmitting a first initial signal; and/or, forming a second initial signal line extending along the first direction in at least one unit row, and forming a second connection line extending along the second direction in at least one dummy column, wherein the second initial signal line is connected with the second connection line to form a mesh structure for transmitting a second initial signal.

Other aspects may be understood upon reading and understanding drawings and detailed description.

BRIEF DESCRIPTION OF DRAWINGS

The accompanying drawings are used for providing understanding of technical solutions of the present disclosure, and constitute a part of the specification. They are used for explaining the technical solutions of the present disclosure together with embodiments of the present disclosure, but do not constitute a limitation on the technical solutions of the present disclosure.

| Reference signs are described as follows. | | |
|---|---|---|
| 11-first active layer; | 12-second active layer; | 13-third active layer; |
| 14-fourth active layer; | 15-fifth active layer; | 16-sixth active layer; |
| 17-seventh active layer; | 18-fracture; | 21-first scan signal line; |
| 22-second scan signal line; | 23-light emitting control line; | 24-first electrode plate; |
| 31-second initial signal line; | 32-connection block; | 33-second electrode plate; |
| 34-electrode plate connection line; | 35-opening; | 41-first connection electrode; |
| 42-second connection electrode; | 43-third connection electrode; | 44-fourth connection electrode; |
| 45-fifth connection electrode; | 46-sixth connection electrode; | 47-first initial signal line; |
| 48-inter-electrode connection electrode; | 51-data signal line; | 52-first connection line; |
| 53-shielding electrode; | 54-anode connection electrode; | 60-first connection line; |
| 70-first initial electrode; | 80-second connection line; | 90-second initial electrode; |
| 100-display region; | 101-base substrate; | 102-drive circuit layer; |
| 103-light emitting structure layer; | 104-encapsulation layer; | 110-first region; |
| 120-second region; | 121-second pixel region; | 122-gate circuit region; |
| 130-third region; | 131-third pixel region; | 132-fan-out line region; |
| 200-bonding region; | 300-bezel region; | 301-anode; |
| 302-pixel definition layer; | 303-organic emitting layer; | 304-cathode; |
| 401-first encapsulation layer; | 402-second encapsulation layer; | 403-third encapsulation layer. |

Figure 7A:
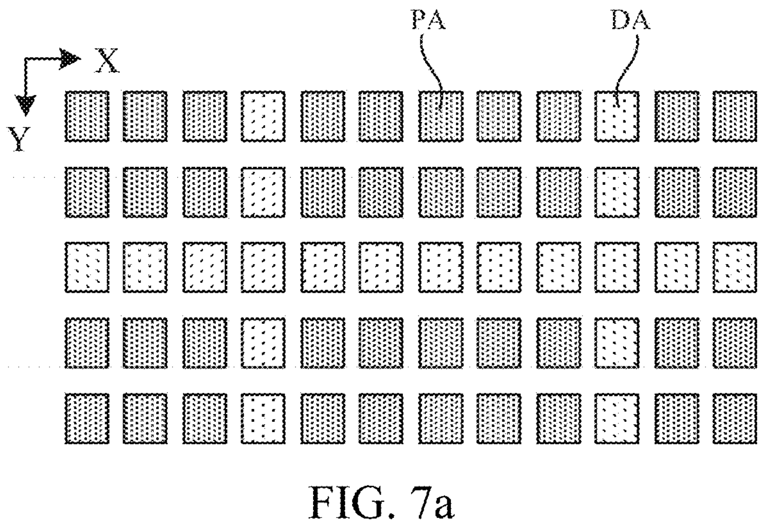
FIG. 7*a* is a schematic diagram of a planar structure of a first circuit region according to an exemplary embodiment of the present disclosure.
Figure 7B:
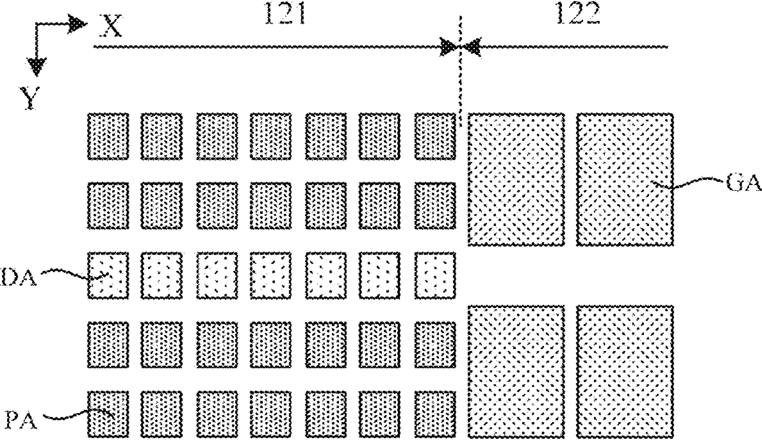
Figure 7B:

FIG. 7*b* is a schematic diagram of a planar structure of a second circuit region according to an exemplary embodiment of the present disclosure.

Figure 7C:
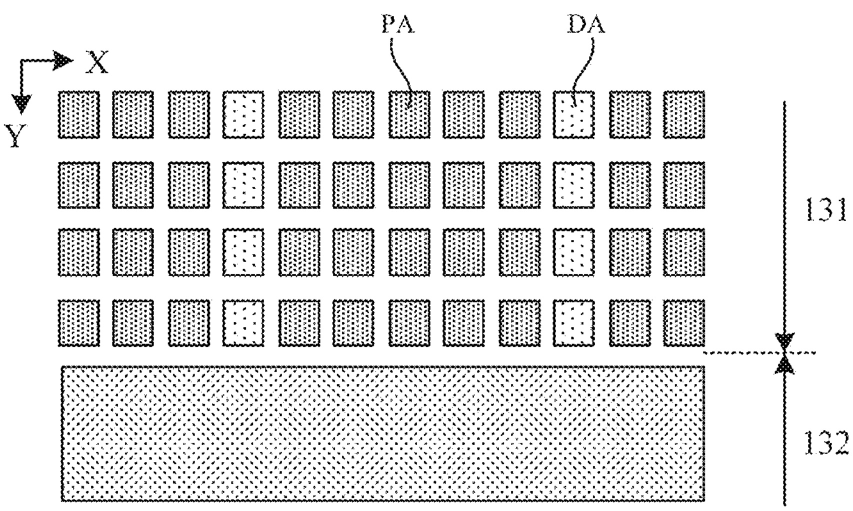

FIG. 7*c* is a schematic diagram of a planar structure of a third circuit region according to an exemplary embodiment of the present disclosure.

Figure 8:
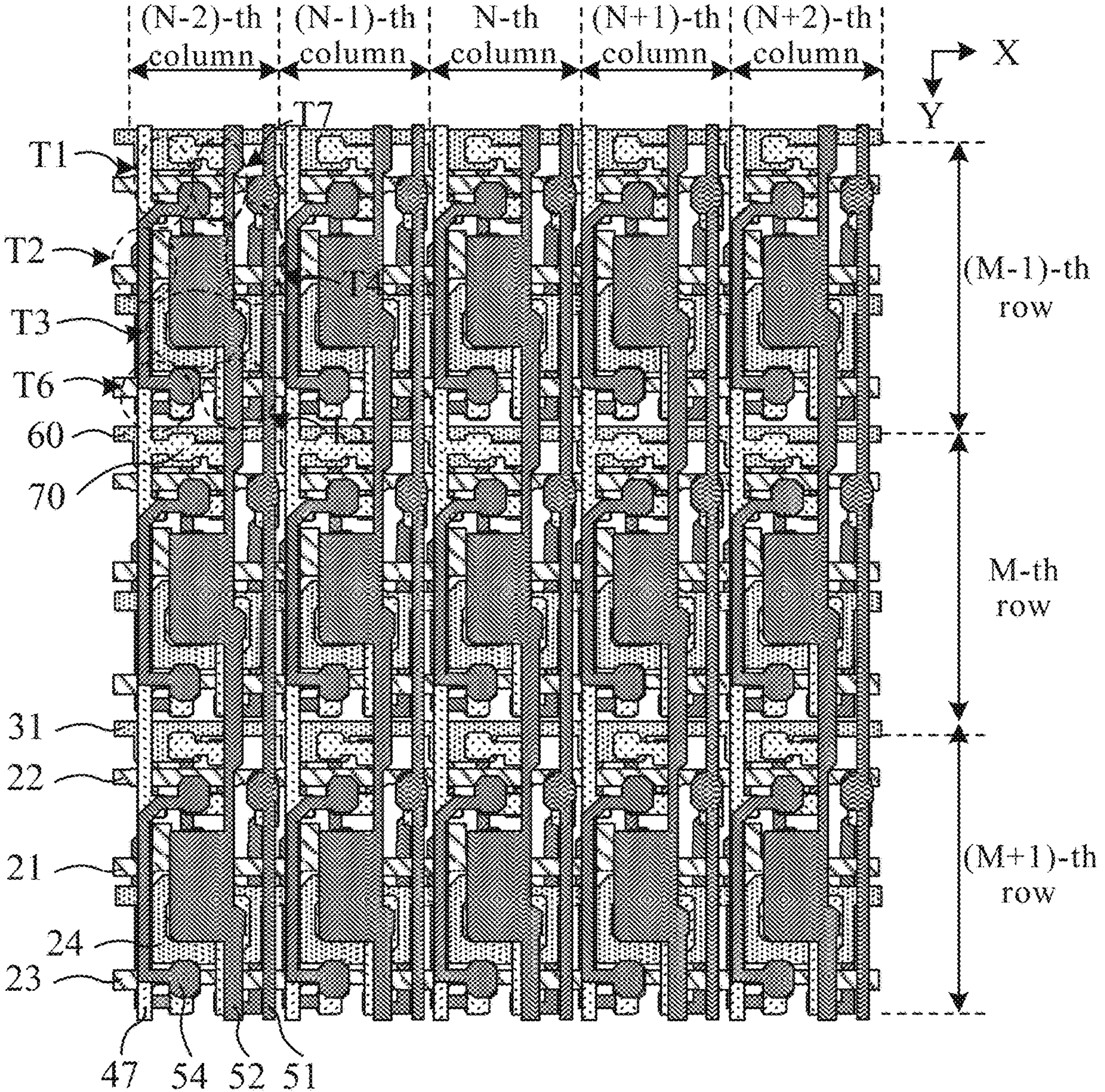

FIG. 8 is a schematic diagram of a structure of a first circuit region according to an exemplary embodiment of the present disclosure.

Figure 9:
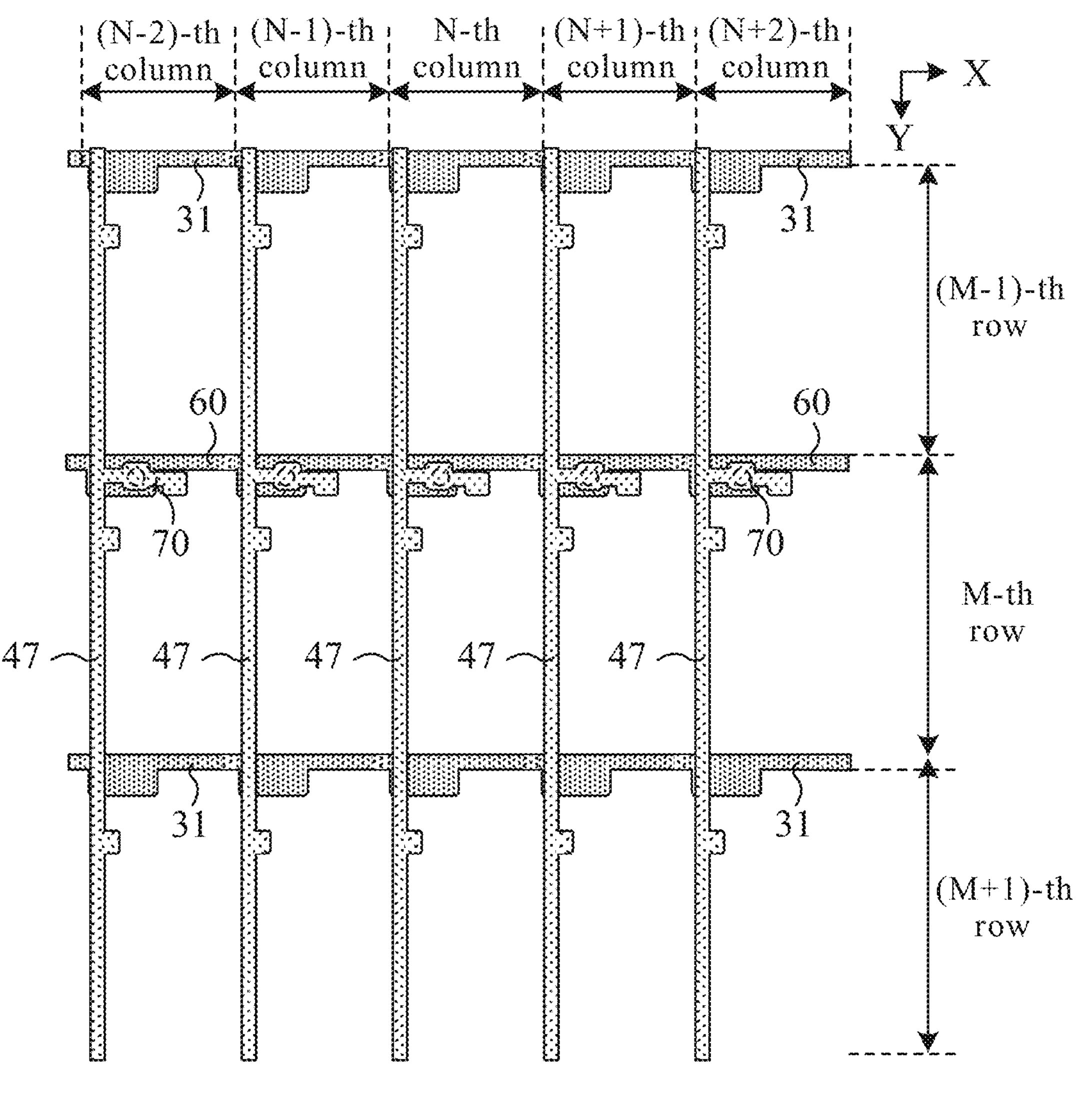

FIG. 9 is a schematic diagram of an initial signal line with a mesh structure according to an exemplary embodiment of the present disclosure.

Figure 10:
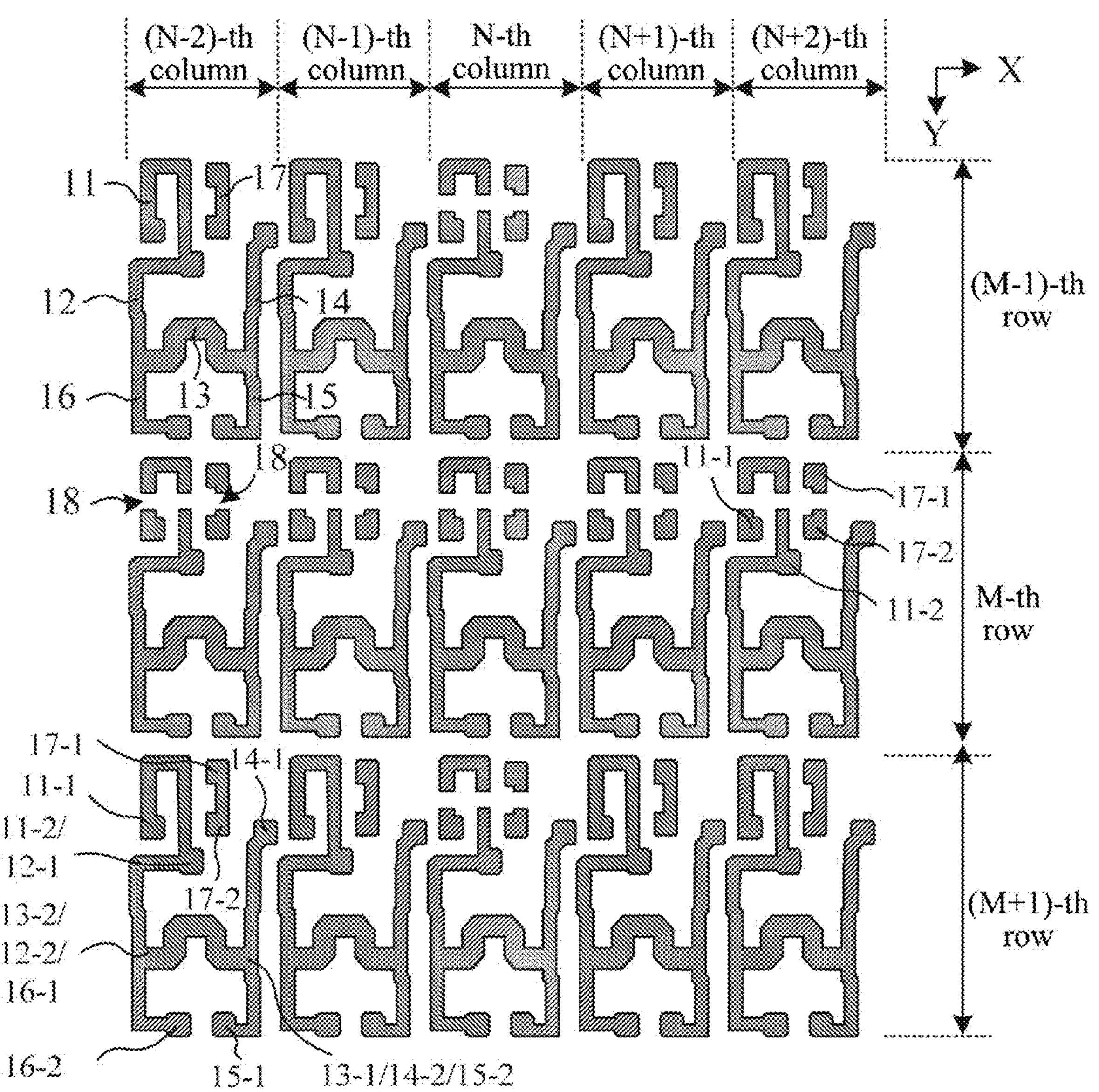

FIG. 10 is a schematic diagram of a display substrate after a pattern of a semiconductor layer is formed according to the present disclosure.

Figure 11A:
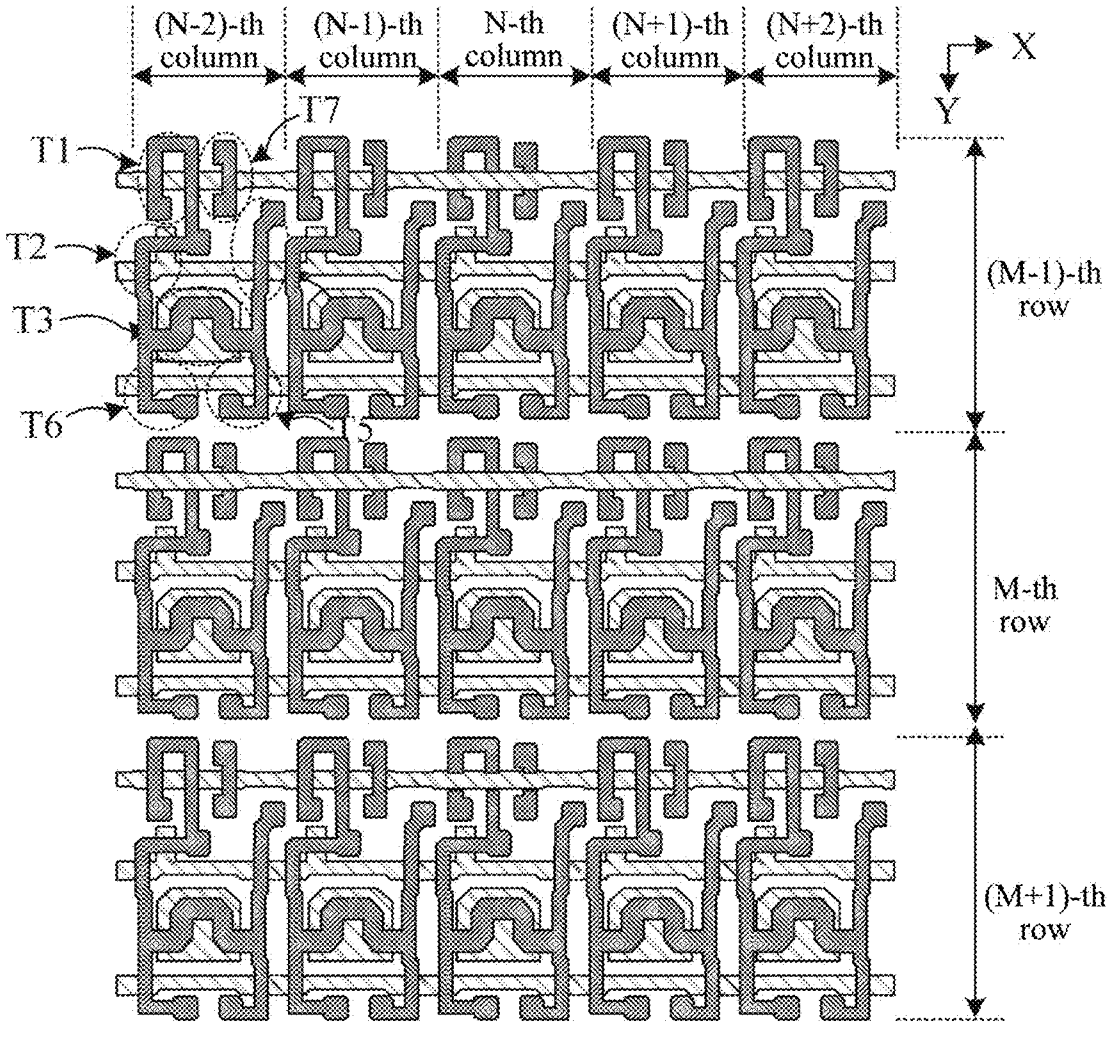
Figure 11B:
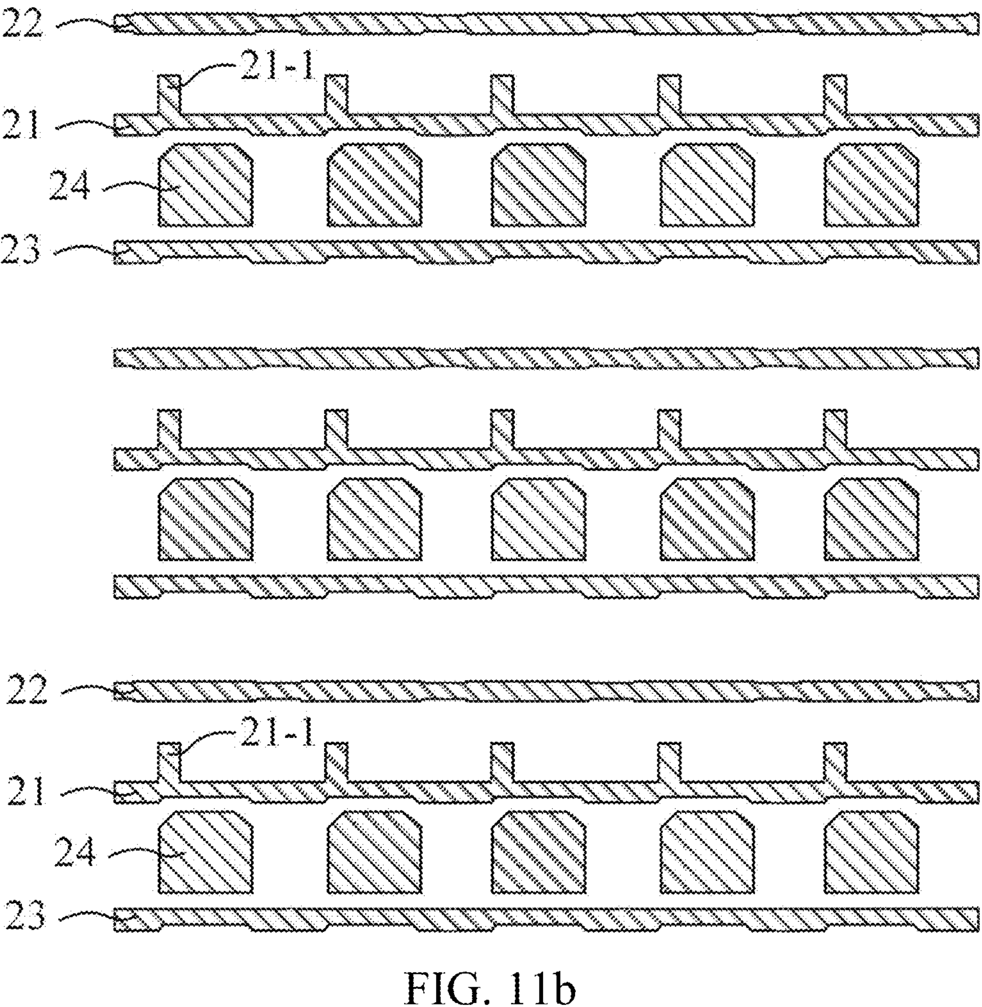

FIG. 11*a* and FIG. 11*b* are schematic diagrams of a display substrate after a pattern of a first conductive layer is formed according to the present disclosure.

Figure 12A:
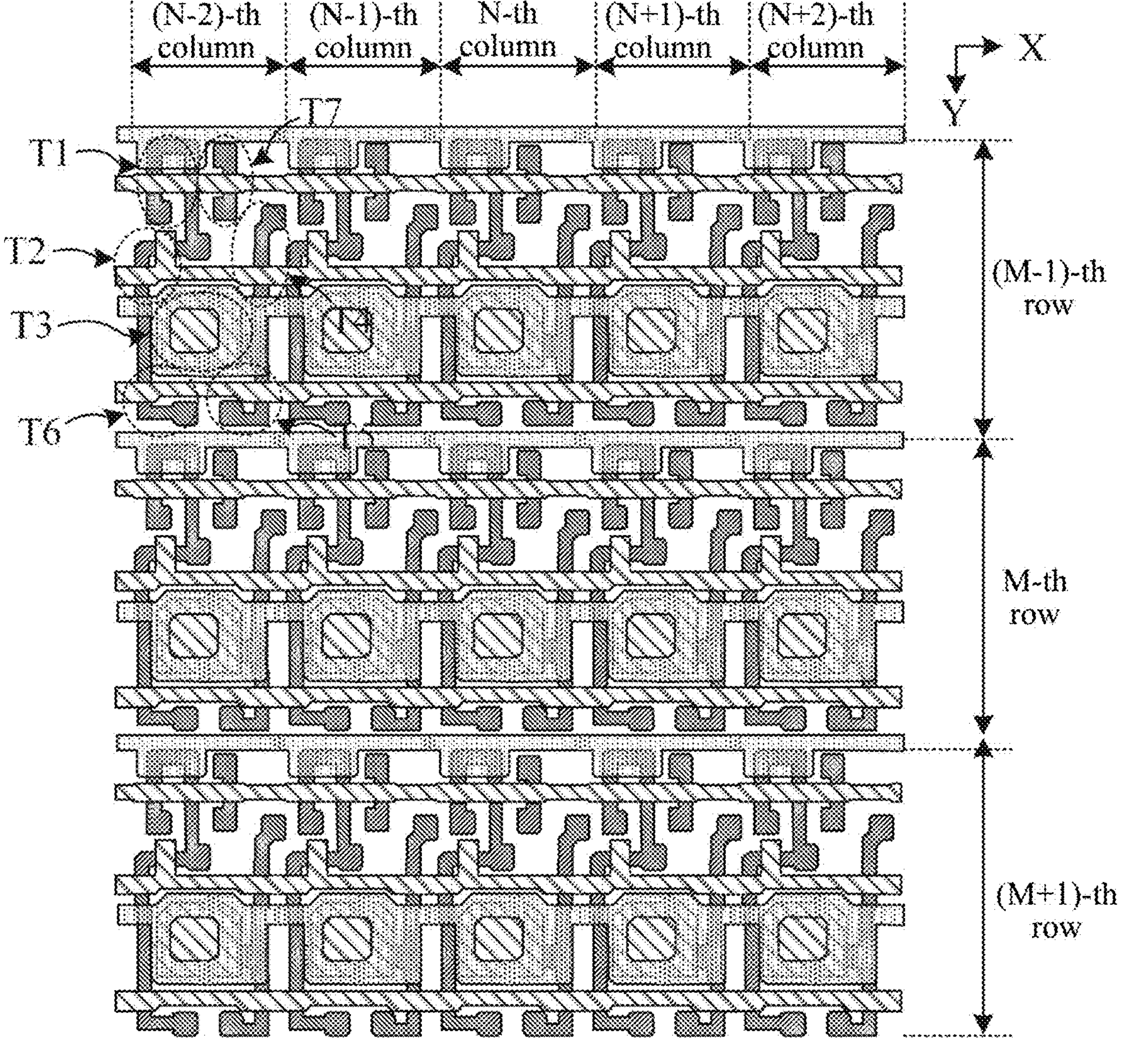
Figure 12B:
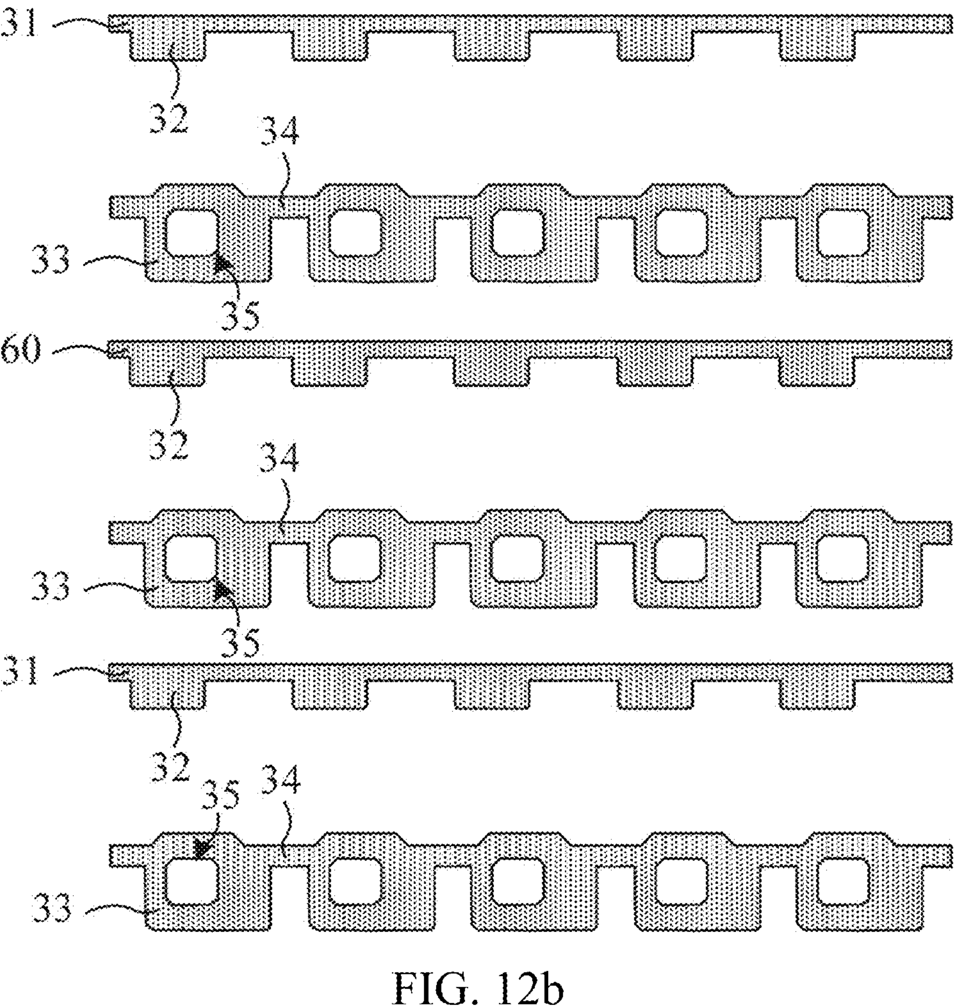

FIG. 12*a* and FIG. 12*b* are schematic diagrams of a display substrate after a pattern of a second conductive layer is formed according to the present disclosure.

Figure 13:
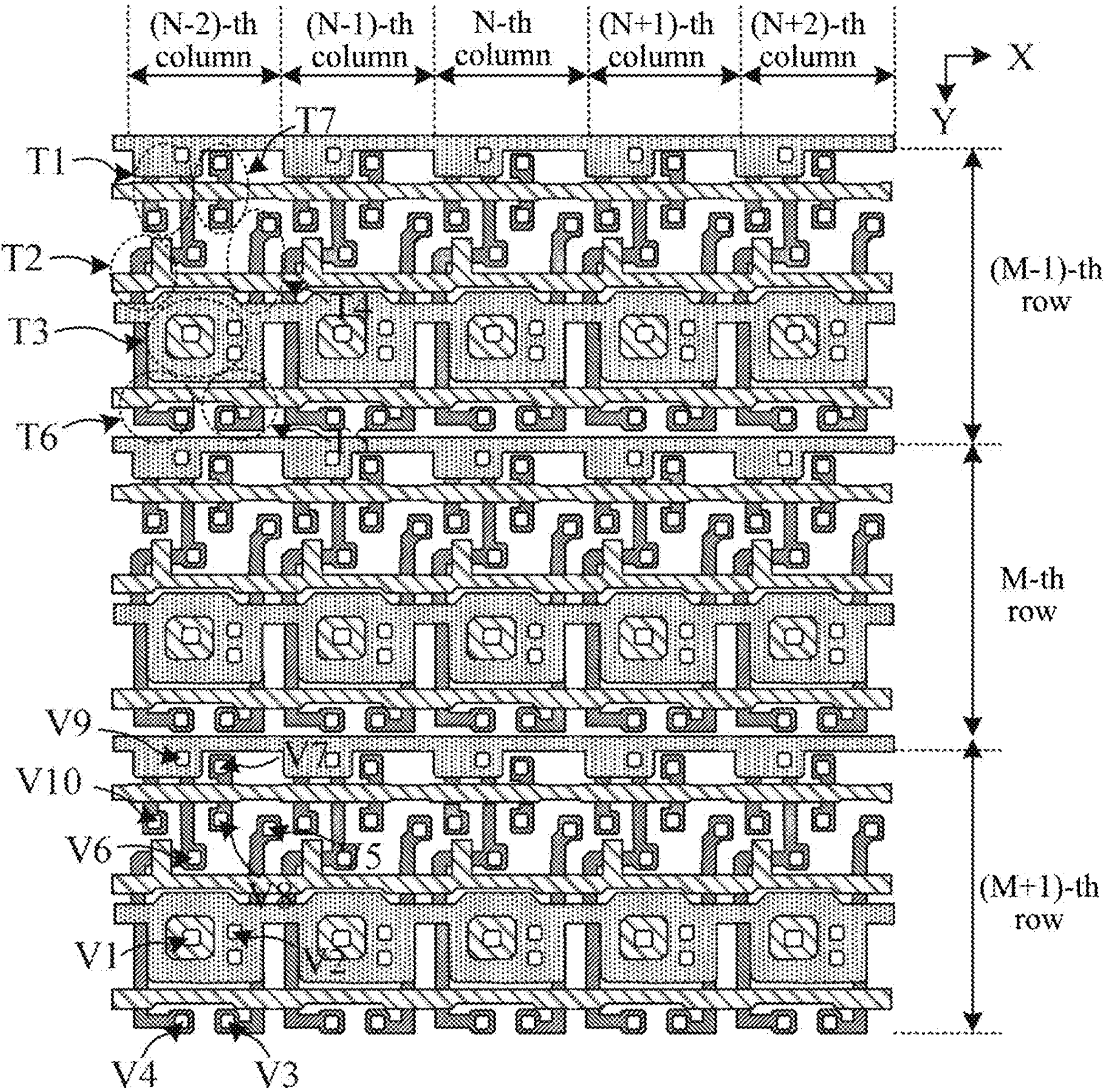

FIG. 13 is a schematic diagram of a display substrate after a pattern of a fourth insulation layer is formed according to the present disclosure.

Figure 14A:
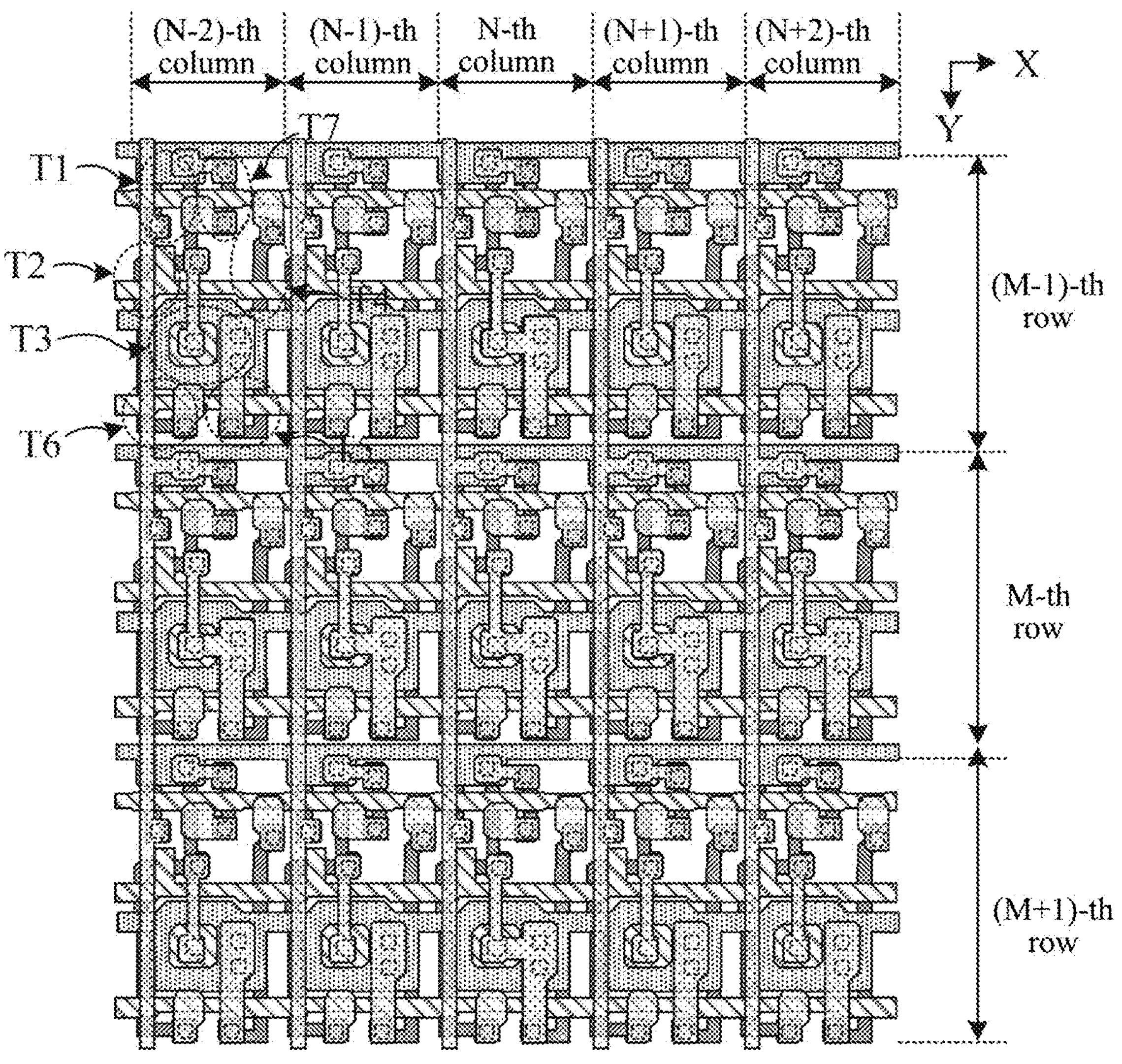
Figure 14B:
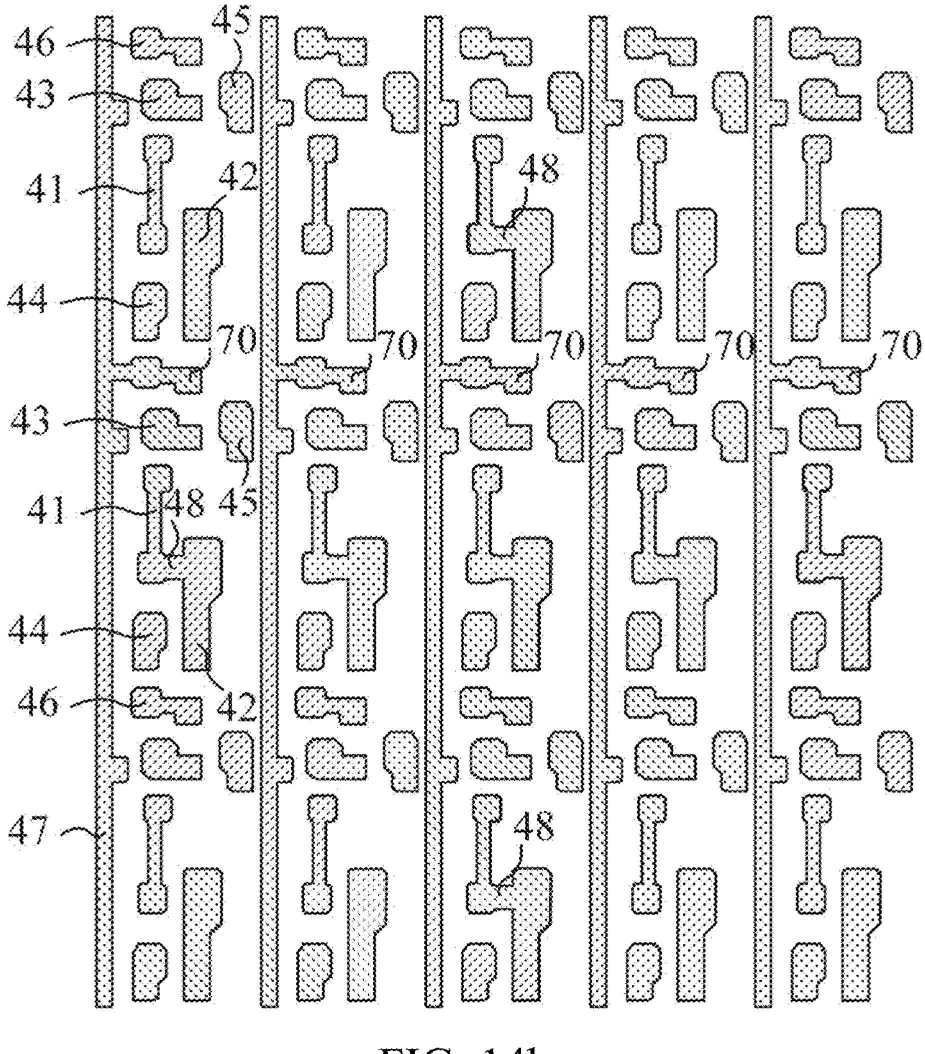

FIG. 14*a* and FIG. 14*b* are schematic diagrams of a display substrate after a pattern of a third conductive layer is formed according to the present disclosure.

Figure 15:
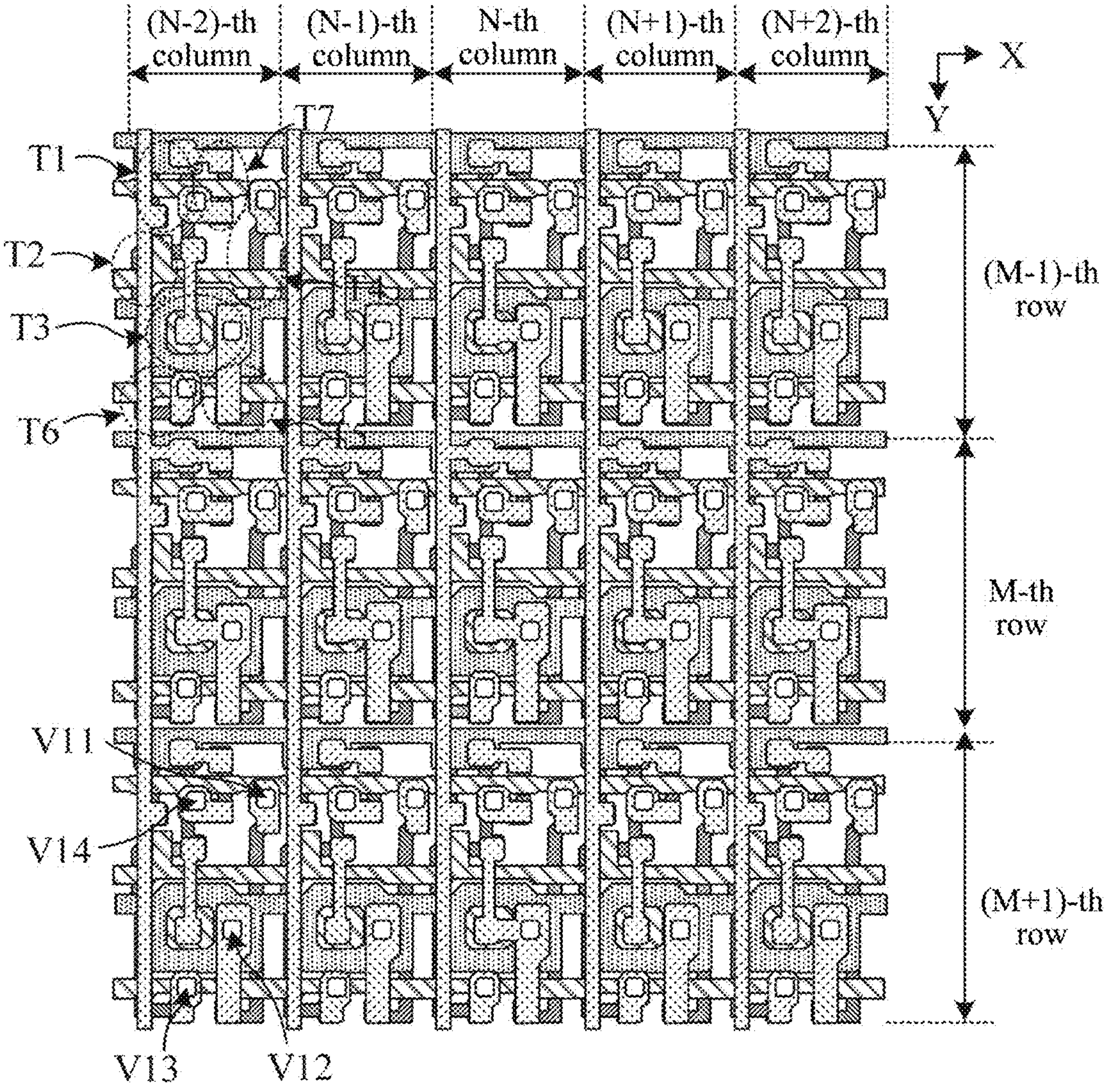

FIG. 15 is a schematic diagram of a display substrate after a pattern of a first planarization layer is formed according to the present disclosure.

DETAILED DESCRIPTION

To make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that modes and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

A scale of the drawings in the present disclosure may be used as a reference in an actual process, but is not limited thereto. For example, a width-length ratio of a channel, a thickness and a pitch of each film layer, and a width and a pitch of each signal line may be adjusted according to actual needs. A quantity of pixels in a display substrate and a quantity of sub-pixels in each pixel are not limited to numbers shown in the drawings. The drawings described in the present disclosure are structural schematic diagrams only, and one mode of the present disclosure is not limited to shapes, numerical values, or the like shown in the drawings.

Ordinal numerals such as “first”, “second”, and “third” in the specification are set to avoid confusion of constituent elements, but not to set a limit in quantity.

In the specification, for convenience, wordings indicating orientations or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection. It may be a mechanical connection or an electrical connection. It may be a direct mutual connection, or an indirect connection through middleware, or internal communication between two elements. Those of ordinary skill in the art may understand specific meanings of these terms in the present disclosure according to specific situations.

In the specification, a transistor refers to an element which includes at least three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, a first electrode may be a source electrode, and a second electrode may be a drain electrode. In a case that transistors with opposite polarities are used, in a case that a direction of a current is changed during operation of a circuit, or the like, functions of the "source electrode" and the "drain electrode" are sometimes interchangeable. Therefore, in the specification, the "source electrode" and the "drain electrode" are interchangeable, and a "source terminal" and a "drain terminal" are interchangeable.

In the specification, an "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switching elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 800 and below 100°, and thus also includes a state in which the angle is above 850 and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

A triangle, rectangle, trapezoid, pentagon, or hexagon, etc. in this specification is not strictly defined, and it may be an approximate triangle, rectangle, trapezoid, pentagon, or hexagon, etc. There may be some small deformation caused by tolerance, and there may be a chamfer, an arc edge, and deformation, etc.

In the present disclosure, "about" refers to that a boundary is not defined so strictly and numerical values within process and measurement error ranges are allowed.

Figures 1, 2:
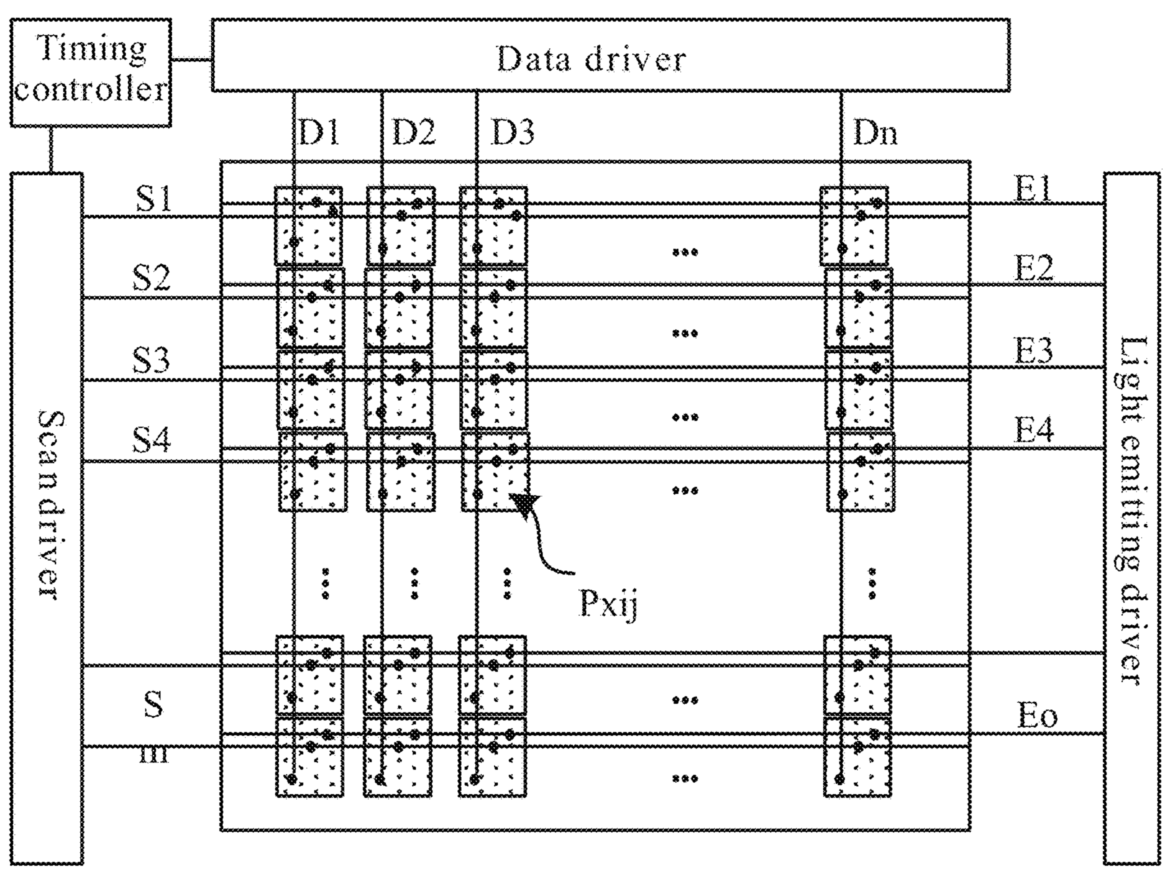
FIG. 1 is a schematic diagram of a structure of a display apparatus.
FIG. 2 is a schematic diagram of a structure of a display substrate.

FIG. 1 is a schematic diagram of a structure of a display apparatus. As shown in FIG. 1, the display apparatus may include a timing controller, a data driver, a scan driver, a light emitting driver, and a pixel array. The timing controller is connected with the data driver, the scan driver, and the light emitting driver, respectively, the data driver is connected with multiple data signal lines (D1 to Dn) respectively, the scan driver is connected with multiple scan signal lines (S1 to Sm) respectively, and the light emitting driver is connected with multiple light emitting signal lines (E1 to Eo) respectively. The pixel array may include multiple sub-pixels Pxij, wherein i and j may be natural numbers. At least one sub-pixel Pxij may include a circuit unit and a light emitting device connected with the circuit unit, wherein the circuit unit may at least include a pixel drive circuit, and the pixel drive circuit is connected with a scan signal line, a data signal line, and a light emitting signal line respectively. In an exemplary implementation mode, the timing controller may provide a gray scale value and a control signal, which are suitable for a specification of the data drive, to the data drive, may provide a clock signal, a scan start signal, etc., which are suitable for a specification of the scan drive, to the scan drive, and may provide a clock signal, an emission stop signal, etc., which are suitable for a specification of the light emitting driver, to the light emitting driver. The data driver may generate a data voltage to be provided to the data signal lines D1, D2, D3, . . . , and Dn by using the gray scale value and the control signal that are received from the timing controller. For example, the data driver may sample the gray scale value by using the clock signal and apply a data voltage corresponding to the gray scale value to the data signal lines D1 to Dn by taking a pixel row as a unit, wherein n may be a natural number. The scan driver may receive the clock signal, the scan start signal, etc., from the timing controller to generate a scan signal to be provided to the scan signal lines S1, S2, S3, . . . , and Sm. For example, the scan driver may provide a scan signal with an on-level pulse to the scan signal lines S1 to Sm sequentially. For example, the scan driver may be constructed in a form of a shift register and may generate a scan signal in a manner in which a scan start signal provided in a form of an on-level pulse is transmitted to a next-stage circuit sequentially under control of the clock signal, wherein m may be a natural number. The light emitting driver may receive a clock signal, an emission stop signal, etc., from the timing controller to generate an emission signal to be provided to the light emitting signal lines E1, E2, E3, . . . , and Eo. For example, the light emitting driver may provide an emission signal with an off-level pulse to the light emitting signal lines E1 to Eo sequentially. For example, the light emitting driver may be constructed in a form of a shift register and may generate an emission signal in a manner in which an emission stop signal provided in a form of an off-level pulse is transmitted to a next-stage circuit sequentially under control of the clock signal, wherein o may be a natural number.

FIG. 2 is a schematic diagram of a structure of a display substrate. As shown in FIG. 2, the display substrate may include a display region 100, a bonding region 200 located on one side of the display region 100, and a bezel region 300 on another side of the display region 100. In an exemplary implementation mode, the display region 100 may be a flat region including multiple sub-pixels Pxij that constitute a pixel array, the multiple sub-pixels Pxij are configured to display a dynamic picture or a still image, and the display region 100 may be referred to as an Active Area (AA). In an exemplary implementation mode, the display substrate may be deformable, e.g., may be crimped, bent, folded, or rolled.

In an exemplary implementation mode, the bonding region 200 may include a fan-out region, a bending region, a drive chip region, and a bonding pin region that are disposed sequentially along a direction away from the display region 100. The fan-out region is connected with the display region, and may at least include a data fan-out line, a high voltage power supply line, and a low voltage power supply line. Multiple data fan-out lines are configured to be connected with data signal lines of the display region in a Fan-out trace manner, the high voltage power supply line is configured to be connected with a first power supply line (VDD) of the display region 100, and the low voltage power supply line is configured to be connected with a second power supply line (VSS) of the bezel region 300. The bending region is connected to the fan-out region and may include a composite insulation layer provided with a groove, and is configured to bend the bonding region to a back of the display region. The drive chip region may include an Integrated Circuit (IC for short) and is configured to be connected with the multiple data fan-out lines. The bonding pin region may at least include multiple bonding pads, and is configured to be bonded and connected with an external Flexible Printed Circuit (FPC for short).

In an exemplary implementation mode, the bezel region 300 may include a circuit region, a power supply line region, a crack dam region, and a cutting region which are sequentially disposed along a direction away from the display region 100. The circuit region is connected to the display region 100 and may at least include a gate drive circuit which is connected with a first scan signal line, a second scan signal line, and a light emitting control line of a pixel drive circuit in the display region 100. The power supply line region is connected to the circuit region and may at least include a power supply lead line, and the power supply lead line extends along a direction parallel to an edge of the display region and is connected with a cathode in the display region 100. The crack dam region is connected to the power supply line region and may at least include multiple cracks provided on a composite insulation layer. The cutting region is connected to the crack dam region and may at least include a cutting groove provided on the composite insulation layer, and the cutting groove is configured such that a cutting device cuts along the cutting groove respectively after preparation of all film layers of the display substrate are completed.

In an exemplary implementation mode, the fan-out region in the bonding region 200 and the power supply line region in the bezel region 300 may be provided with a first isolation dam and a second isolation dam, the first isolation dam and the second isolation dam may extend along a direction parallel to an edge of the display region 100, thus forming an annular structure surrounding the display region 100, wherein the edge of the display region is an edge the display region on one side of the bonding region or the bezel region.

Figures 3, 4:
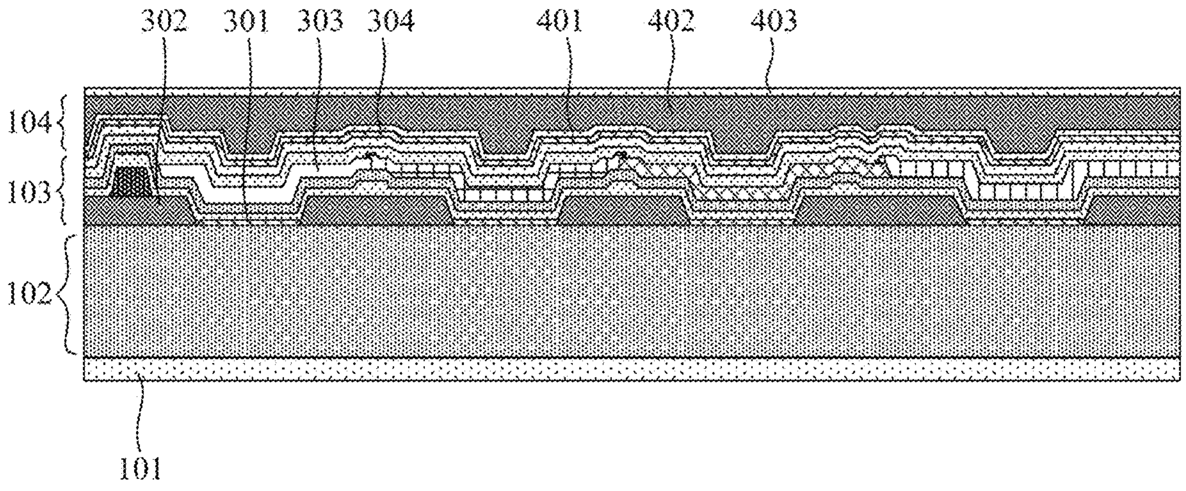
FIG. 3 is a schematic diagram of a sectional structure of a display region in a display substrate.
FIG. 4 is a schematic diagram of an equivalent circuit of a pixel drive circuit.

FIG. 3 is a schematic diagram of a sectional structure of a display region in a display substrate, illustrating a structure of four sub-pixels of the display region. As shown in FIG. 3, on a plane perpendicular to the display substrate, the display substrate may include a drive circuit layer 102 disposed on a base substrate 101, a light emitting structure layer 103 disposed on a side of the drive circuit layer 102 away from the base substrate, and an encapsulation layer 104 disposed on a side of the light emitting structure layer 103 away from the base substrate. In some possible implementation modes, the display substrate may include another film layer, such as a touch structure layer, which is not limited here in the present disclosure.

In an exemplary implementation mode, the base substrate 101 may be a flexible base substrate, or may be a rigid base substrate. The drive circuit layer 102 may include multiple circuit units, a circuit unit may at least include a pixel drive circuit, and the pixel drive circuit may include multiple transistors and a storage capacitor. The light emitting structure layer 103 may include multiple sub-pixels, each sub-pixel may include a light emitting device and a pixel definition layer 302. The light emitting device may include an anode 301, an organic emitting layer 303, and a cathode 304, the organic emitting layer 303 is disposed between the anode 301 and the cathode 304, and the organic emitting layer 303 emits light of a corresponding color under drive of the anode 301 and the cathode 304. The encapsulation structure layer 104 may include a first encapsulation layer 401, a second encapsulation layer 402, and a third encapsulation layer 403 which are stacked, wherein the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403, and it may be ensured that external water vapor cannot enter the light emitting structure layer 103.

In an exemplary implementation mode, the organic emitting layer may include an Emitting Layer (EML), and any one or more of following layers: a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In an exemplary implementation mode, one or more layers of hole injection layers, hole transport layers, electron block layers, hole block layers, electron transport layers, and electron injection layers of all sub-pixels may be a common layer connected together. Emitting layers of adjacent sub-pixels may be overlapped slightly, or may be mutually isolated.

FIG. 4 is a schematic diagram of an equivalent circuit of a pixel drive circuit. In an exemplary implementation mode, the pixel drive circuit may have a structure of 3T1C, 4T1C, 5T1C, 5T2C, 6T1C, 7T1C, or 8T1C. As shown in FIG. 4, the pixel drive circuit may include seven transistors (a first transistor T1 to a seventh transistor T7), and one storage capacitor C, and the pixel drive circuit is respectively connected with eight signal lines (a data signal line D, a first scan signal line S1, a second scan signal line S2, a light emitting signal line E, a first initial signal line INIT1, a second initial signal line INIT2, a first power supply line VDD, and a second power supply line VSS).

In an exemplary implementation mode, the pixel drive circuit may include a first node N1, a second node N2, and a third node N3. Herein, the first node N1 is respectively connected with a first electrode of the third transistor T3, a second electrode of the fourth transistor T4, and a second electrode of the fifth transistor T5, the second node N2 is respectively connected with a second electrode of the first transistor, a first electrode of the second transistor T2, a control electrode of the third transistor T3, and a second end of the storage capacitor C, and the third node N3 is respectively connected with a second electrode of the second transistor T2, a second electrode of the third transistor T3, and a first electrode of the sixth transistor T6.

In an exemplary implementation mode, a first end of the storage capacitor C is connected with the first power supply line VDD, and the second end of the storage capacitor C is connected with the second node N2, i.e., the second end of the storage capacitor C is connected with the control electrode of the third transistor T3.

A control electrode of the first transistor T1 is connected with the second scan signal line S2, a first electrode of the first transistor T1 is connected with the first initial signal line INIT1, and a second electrode of the first transistor is connected with the second node N2. When a scan signal with an on-level is applied to the second scan signal line S2, the first transistor T1 transmits a first initial voltage to the control electrode of the third transistor T3 so as to initialize a charge amount of the control electrode of the third transistor T3.

A control electrode of the second transistor T2 is connected with the first scan signal line S1, the first electrode of the second transistor T2 is connected with the second node N2, and the second electrode of the second transistor T2 is connected with the third node N3. When a scan signal with an on-level is applied to the first scan signal line S1, the second transistor T2 enables the control electrode of the third transistor T3 to be connected with the second electrode of the third transistor T3.

The control electrode of the third transistor T3 is connected with the second node N2, i.e., the control electrode of the third transistor T3 is connected with the second end of the storage capacitor C, the first electrode of the third transistor T3 is connected with the first node N1, and the second electrode of the third transistor T3 is connected with the third node N3. The third transistor T3 may be referred to as a drive transistor, and the third transistor T3 determines an amount of a drive current flowing between the first power supply line VDD and the second power supply line VSS according to a potential difference between the control electrode and the first electrode of the third transistor T3.

A control electrode of the fourth transistor T4 is connected with the first scan signal line S1, a first electrode of the fourth transistor T4 is connected with the data signal line D, and the second electrode of the fourth transistor T4 is connected with the first node N1. The fourth transistor T4 may be referred to as a switching transistor, a scan transistor, etc., and when a scan signal with an on-level is applied to the first scan signal line S1, the fourth transistor T4 enables a data voltage of the data signal line D to be input to the pixel drive circuit.

A control electrode of the fifth transistor T5 is connected with the light emitting signal line E, a first electrode of the fifth transistor T5 is connected with the first power supply line VDD, and the second electrode of the fifth transistor T5 is connected with the first node N1. A control electrode of the sixth transistor T6 is connected with the light emitting signal line E, the first electrode of the sixth transistor T6 is connected with the third node N3, and a second electrode of the sixth transistor T6 is connected with a first electrode of a light emitting device. The fifth transistor T5 and the sixth transistor T6 may be referred to as light emitting transistors. When a light emitting signal with an on-level is applied to the light emitting signal line E, the fifth transistor T5 and the sixth transistor T6 enable the light emitting device to emit light by forming a drive current path between the first power supply line VDD and the second power supply line VSS.

A control electrode of the seventh transistor T7 is connected with the second scan signal line S2, a first electrode of the seventh transistor T7 is connected with the second initial signal line INIT2, and a second electrode of the seventh transistor T7 is connected with the first electrode of the light emitting device. When a scan signal with an on-level is applied to the second scan signal line S2, the seventh transistor T7 transmits a second initial voltage to the first electrode of the light emitting device so as to initialize a charge amount accumulated in the first electrode of the light emitting device or release a charge amount accumulated in the first electrode of the light emitting device.

In an exemplary implementation mode, the light emitting device may be an OLED including a first electrode (anode), an organic emitting layer, and a second electrode (cathode), which are stacked, or may be a QLED including a first electrode (anode), a quantum dot emitting layer, and a second electrode (cathode), which are stacked.

In an exemplary implementation mode, a second electrode of the light emitting device is connected with the second power supply line VSS, a signal of the second power supply line VSS is a low-level signal, and a signal of the first power supply line VDD is a high-level signal that is continuously provided.

In an exemplary implementation mode, the first transistor T1 to the seventh transistor T7 may be P-type transistors, or may be N-type transistors. Use of a same type of transistors in a pixel drive circuit may simplify a process flow, reduce process difficulties of a display panel, and improve a product yield. In some possible implementation modes, the first transistor T1 to the seventh transistor T7 may include a P-type transistor and an N-type transistor.

In an exemplary implementation mode, for the first transistor T1 to the seventh transistor T7, a low temperature polycrystalline silicon thin film transistor may be adopted, or an oxide thin film transistor may be adopted, or a low temperature polycrystalline silicon thin film transistor and an oxide thin film transistor may be adopted. An active layer of a low temperature polycrystalline silicon thin film transistor may be made of Low Temperature Poly-Silicon (LTPS for short), and an active layer of an oxide thin film transistor may be made of an oxide semiconductor (Oxide). The low temperature polycrystalline silicon thin film transistor has advantages such as a high migration rate and fast charging. The oxide thin film transistor has advantages such as a low leakage current. The low temperature polycrystalline silicon thin film transistor and the oxide thin film transistor are integrated on a display substrate to form a Low Temperature Polycrystalline Oxide (LTPO for short) display substrate, so that advantages of the two may be utilized, low-frequency drive may be achieved, power consumption may be reduced, and display quality may be improved.

In an exemplary implementation mode, taking a case that seven transistors in FIG. 4 are all P-type transistors as an example, a working process of the pixel drive circuit may include following stages.

In a first stage A1, referred to as a reset stage, a signal of the second scan signal line S2 is a low-level signal, and signals of the first scan signal line S1 and the light emitting signal line E are high-level signals. The signal of the second scan signal line S2 is the low-level signal, so that the first transistor T1 and the seventh transistor T7 are turned on. The first transistor T1 is turned on so that a first initial voltage of the first initial signal line INIT1 is provided to the second node N2 to initialize the storage capacitor C to clear an original data voltage in the storage capacitor. The seventh transistor T7 is turned on, so that a second initial voltage of the second initial signal line INIT2 is provided to a first electrode of an OLED to initialize (reset) the first electrode of the OLED and clear its internal pre-stored voltage, thereby completing initialization. The signals of the first scan signal line S1 and the light emitting signal line E are the high-level signals, so that the second transistor T2, the fourth transistor T4, the fifth transistor T5, and the sixth transistor T6 are turned off. The OLED does not emit light in this stage.

In a second stage A2, referred to as a data writing stage or a threshold compensation stage, a signal of the first scan signal line S1 is a low-level signal, signals of the second scan signal line S2 and the light emitting signal line E are high-level signals, and the data signal line D outputs a data voltage. In this stage, the second end of the storage capacitor C is at a low level, so the third transistor T3 is turned on. The signal of the first scan signal line S1 is the low-level signal, so that the second transistor T2 and the fourth transistor T4 are turned on. The second transistor T2 and the fourth transistor T4 are turned on, so that the data voltage output by the data signal line D is provided to the second node N2 through the first node N1, the turned-on third transistor T3, the third node N3, and the turned-on second transistor T2, and the storage capacitor C is charged with a difference between the data voltage output by the data signal line D and a threshold voltage of the third transistor T3. A voltage at the second end (the second node N2) of the storage capacitor C is $Vd-|Vth|$, wherein Vd is the data voltage output by the data signal line D, and Vth is the threshold voltage of the third transistor T3. A signal of the second scan signal line S2 is a high-level signal, so that the first transistor T1 and the seventh transistor T7 are turned off. A signal of the light emitting signal line E is a high-level signal, so that the fifth transistor T5 and the sixth transistor T6 are turned off.

In a third stage A3, referred to as a light emitting stage, a signal of the light emitting signal line E is a low-level signal, and signals of the first scan signal line S1 and the second scan signal line S2 are high-level signals. The signal of the light emitting signal line E is the low-level signal, so that the fifth transistor T5 and the sixth transistor T6 are turned on, and a power voltage output by the first power supply line VDD provides a drive voltage to the first electrode of the OLED through the turned-on fifth transistor T5, the third transistor T3, and the sixth transistor T6 to drive the OLED to emit light.

In a drive process of the pixel drive circuit, a drive current flowing through the third transistor T3 (drive transistor) is determined by a voltage difference between a gate electrode and the first electrode of the third transistor T3. A voltage of the second node N2 is $Vdata-|Vth|$, so the drive current of the third transistor T3 is as follows.

$$I = K\times(Vgs-Vth)^2 = K\times[(Vdd-Vd+|Vth|)-Vth]^2 = K\times[(Vdd-Vd]^2$$

I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power supply line VDD.

With development of OLED display technologies, consumers have higher requirements for a display effect of a display product. A narrow bezel and a full screen have become a new trend in development of display products. Therefore, bezel narrowing or even a frameless design has received more attention in a design of an OLED display product. Since signal lines of an integrated circuit and a bonding pad in a bonding region need to be led into a relatively wide display region through data fan-out lines in a fan-out manner, a fan-shaped region occupies relatively large space, resulting in a relatively large width of a lower bezel. Since a bezel region needs to be provided with a gate drive circuit and a power supply lead line and the gate drive circuit and the power supply lead line occupy relatively large space, widths of left and right bezels are relatively large.

An exemplary embodiment of the present disclosure provides a display substrate, and a structure in which a data fan-out line is located in a display region (Fan-out in AA, abbreviated as FIAA) and a structure in which a gate drive circuit is located in a display region (Gate Driver In AA, abbreviated as GIA) are adopted.

Figure 5:
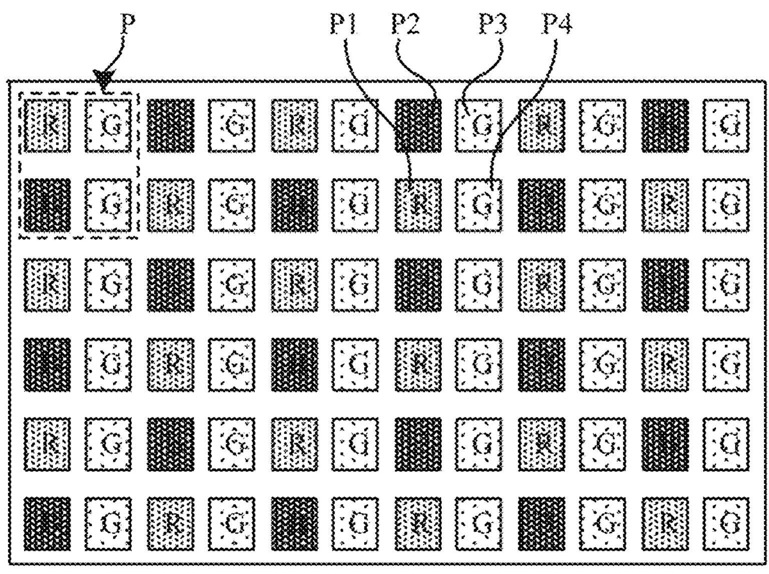
FIG. 5 is a schematic diagram of a planar structure of a light emitting structure layer in a display substrate according to an embodiment of the present disclosure.

FIG. 5 is a schematic diagram of a planar structure of a light emitting structure layer in a display substrate according to an exemplary embodiment of the present disclosure. As shown in FIG. 5, in an exemplary implementation mode, on a plane parallel to the display substrate, the light emitting structure layer of the display substrate may include multiple pixel units P arranged in a matrix manner, at least one pixel unit P may include a first sub-pixel P1 emitting light of a first color, a second sub-pixel P2 emitting light of a second color, and a third sub-pixel P3 and a fourth sub-pixel P4 emitting light of a third color, each of the four sub-pixels may include a light emitting device, the light emitting device in each sub-pixel is respectively connected with a pixel drive circuit of a corresponding circuit unit, and the light emitting device is configured to emit light with corresponding brightness in response to a current output by the connected pixel drive circuit.

In an exemplary implementation mode, the first sub-pixel P1 may be a red sub-pixel (R) emitting red light, the second sub-pixel P2 may be a blue sub-pixel (B) emitting blue light, and the third sub-pixel P3 and the fourth sub-pixel P4 may be green sub-pixels (G) emitting green light. A shape of a sub-pixel may be a rectangle, a rhombus, a pentagon, or a hexagon, etc., and the four sub-pixels may be arranged side by side horizontally, side by side vertically, in a manner to form a square, or in a manner to form a diamond, or the like.

In a possible exemplary implementation mode, the pixel unit may include three sub-pixels, the three sub-pixels may be arranged side by side horizontally, side by side vertically, or in a manner like a Chinese character "品", which is not limited in the present disclosure.

Figure 6:
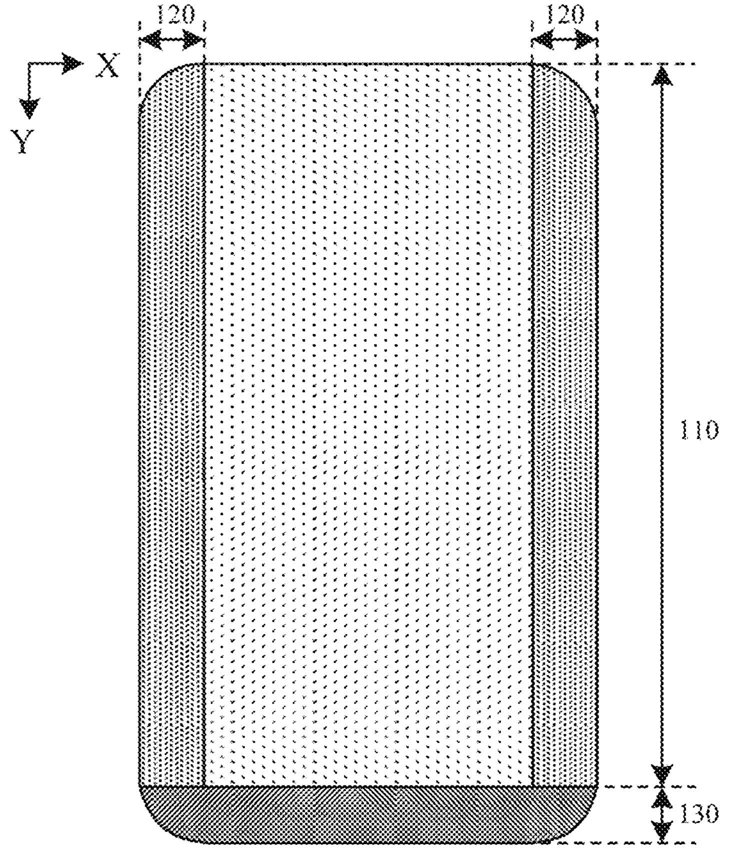
FIG. 6 is a schematic diagram of a planar structure of a drive circuit layer in a display substrate according to an embodiment of the present disclosure.

FIG. 6 is a schematic diagram of a planar structure of a drive circuit layer in a display substrate according to an exemplary embodiment of the present disclosure. As shown in FIG. 6, in an exemplary implementation mode, on a plane parallel to the display substrate, the drive circuit layer of the display region may include a first circuit region 110, a second circuit region 120, and a third circuit region 130, the first circuit region 110 is configured to be provided with multiple circuit units and multiple dummy units, the second circuit region 120 is configured to be provided with a gate drive circuit, multiple circuit units, and multiple dummy units, and the third circuit region 130 is configured to be provided with multiple data fan-out lines, multiple circuit units, and multiple dummy units.

In an exemplary implementation mode, the second circuit region 120 may be provided on one side or both sides of the first circuit region 110 in a first direction X, and may be in a strip shape extending along a second direction Y, the first direction X intersects with the second direction Y.

In an exemplary implementation mode, the third circuit region 130 may be provided on a side of the first circuit region 110 in the second direction Y, the third circuit region 130 is close to a bonding region, and the third circuit region 130 may be in a strip shape extending along the first direction X.

In an exemplary implementation mode, the first direction X may be an extension direction of a scan signal line, the second direction Y may be an extension direction of a data signal line, and the first direction is perpendicular to the second direction.

FIG. 7*a* is a schematic diagram of a planar structure of a first circuit region according to an exemplary embodiment of the present disclosure. As shown in FIG. 7*a*, the first circuit region may include multiple circuit units PA and multiple dummy units DA, the multiple circuit units PA may constitute multiple unit rows and multiple unit columns, and the multiple dummy units DA may constitute at least one dummy row and at least one dummy column.

In an exemplary implementation mode, a unit row may include multiple circuit units PA disposed sequentially along the first direction X and at least one dummy unit DA, and a unit column may include multiple circuit units PA disposed sequentially along the second direction Y and at least one dummy unit DA.

In an exemplary implementation mode, a dummy row may include multiple dummy units DA disposed sequentially along the first direction X, and a dummy column may include multiple dummy units DA disposed sequentially along the second direction Y.

In an exemplary implementation mode, at least one dummy row may be disposed between two unit rows, and at least one dummy column may be disposed between two unit columns.

In an exemplary implementation mode, a circuit unit may at least include a pixel drive circuit, the pixel drive circuit is connected with a scan signal line, a data signal line, and a light emitting signal line respectively. The pixel drive circuit is configured to receive a data voltage transmitted by the data signal line and output a corresponding current to a connected light emitting device under control of the scan signal line and the light emitting signal line.

In an exemplary implementation mode, a dummy unit may at least include a dummy drive circuit, and the dummy drive circuit is configured to present a morphology and a structure of the pixel drive circuit, but does not output a corresponding current.

FIG. 7*b* is a schematic diagram of a planar structure of a second circuit region according to an exemplary embodiment of the present disclosure. As shown in FIG. 7*b*, the second circuit region may include a second pixel region 121 and a gate circuit region 122, and the gate circuit region 122 may be disposed on a side of the second pixel region 121 away from the first circuit region. The second pixel region 121 may include multiple circuit units PA and multiple dummy units DA, and the gate circuit region 122 may include multiple gate circuit units GA.

In an exemplary implementation mode, multiple circuit units PA may constitute multiple unit rows and multiple unit columns, and multiple dummy units DA may constitute at least one dummy row.

In an exemplary implementation mode, only dummy rows are disposed in the second circuit region, and no dummy column is disposed.

In an exemplary implementation mode, the second circuit region may be provided with multiple circuit units PA in a close-packed lateral compression manner, and compressed space serves as setting space of a gate circuit unit GA. Since the gate drive circuit is disposed in the second circuit region in the display region, a width of a bezel of the display apparatus is effectively reduced, and widths of left and right bezels are effectively reduced.

FIG. 7*c* is a schematic diagram of a planar structure of a third circuit region according to an exemplary embodiment of the present disclosure. As shown in FIG. 7*c*, the third circuit region may include a third pixel region 131 and a fan-out line region 132, and the fan-out line region 132 may be disposed on a side of the third pixel region 131 away from the first circuit region. The third pixel region 131 may include multiple circuit units PA and multiple dummy units DA, and the fan-out line region 132 may include multiple data fan-out lines.

In an exemplary implementation mode, multiple circuit units PA may constitute multiple unit rows and multiple unit columns, and multiple dummy units DA may constitute at least one dummy column.

In an exemplary implementation mode, only dummy columns are disposed in the third circuit region, and no dummy row is disposed.

In an exemplary implementation mode, the third circuit region may be provided with multiple circuit units PA in a close-packed lateral compression manner, and compressed space serves as setting space of a data fan-out line. In an exemplary implementation mode, one end of multiple data fan-out lines is correspondingly connected with multiple data signal lines in the third circuit region, and the other end of the multiple data fan-out lines is correspondingly connected with an integrated circuit after extending to a bonding region. Since there is no need to provide a fan-shaped oblique line in the bonding region, a width of a fan-out region is reduced, and a width of a lower bezel is effectively reduced.

In an exemplary implementation mode, both the second circuit region and the third circuit region are provided with circuit units in a close-packed compression manner, in order to maintain uniformity of pixel drive circuits in the display region, the first circuit region is also provided with circuit units in a same close-packed compression manner as the second circuit region and the third circuit region, and compressed space is provided with at least one dummy row and at least one dummy column. In the present disclosure, by providing at least one dummy row and at least one dummy column in the first circuit region, not only may uniformity of display in the display region be ensured, but also a flicker phenomenon may be avoided.

The present disclosure provides a display substrate, the display substrate includes a display region, a bonding region disposed on a side of the display region, and a bezel region disposed on another side of the display region, the display region includes multiple circuit units constituting multiple unit rows and multiple unit columns, and multiple dummy units constituting at least one dummy row and/or at least one dummy column, the dummy row includes multiple dummy units arranged sequentially along a first direction, the dummy column includes multiple dummy units arranged sequentially along a second direction, and the first direction intersects with the second direction; at least one unit column is provided with a first initial signal line extending along the second direction, at least one dummy row is provided with a first connection line extending along the first direction, and the first initial signal line is connected with the first connection line to form a mesh structure for transmitting a first initial signal; and/or, at least one unit row is provided with a second initial signal line extending along the first direction, at least one dummy column is provided with a second connection line extending along the second direction, and the second initial signal line is connected with the second connection line to form a mesh structure for transmitting a second initial signal.

In an exemplary implementation mode, at least one dummy unit in the dummy row includes a first initial electrode, a first end of the first initial electrode is connected with the first initial signal line, and a second end of the first initial electrode is connected with the first connection line.

In another exemplary implementation mode, at least one dummy unit in the dummy column includes a second initial electrode, a first end of the second initial electrode is connected with the second connection line, and a second end of the second initial electrode is connected with the second initial signal line.

In yet another exemplary implementation mode, at least one dummy unit in the dummy row includes a first initial electrode, a first end of the first initial electrode is connected with the first initial signal line, and a second end of the first initial electrode is connected with the first connection line; at least one dummy unit in the dummy column includes a second initial electrode, a first end of the second initial electrode is connected with the second connection line, and a second end of the second initial electrode is connected with the second initial signal line.

In an exemplary implementation mode, at least one circuit unit includes a pixel drive circuit, the pixel drive circuit at least includes a storage capacitor and multiple transistors; in a plane perpendicular to the display substrate, the display substrate includes a semiconductor layer, a first conductive layer, a second conductive layer, and a third conductive layer disposed sequentially on a base substrate, the semiconductor layer at least includes active layers of multiple transistors, the first conductive layer at least includes a first electrode plate of the storage capacitor and gate electrodes of multiple transistors, the second conductive layer at least includes a second electrode plate of the storage capacitor and the second initial signal line, and the third conductive layer at least includes the first initial signal line, and first electrodes and second electrodes of multiple transistors.

In an exemplary implementation mode, the second conductive layer further includes the first connection line, and the third conductive layer further includes a first initial electrode, a first end of the first initial electrode is connected with the first initial signal line, and a second end of the first initial electrode is connected with the first connection line through a via.

In another exemplary implementation mode, the third conductive layer further includes a second initial electrode and the second connection line, a first end of the second initial electrode is connected with the second connection line, and a second end of the second initial electrode is connected with the second initial signal line through a via.

In yet another exemplary implementation mode, the second conductive layer further includes the first connection line, the third conductive layer further includes a first initial electrode, a second initial electrode, and the second connection line, a first end of the first initial electrode is connected with the first initial signal line, a second end of the first initial electrode is connected with the first connection line through a via, a first end of the second initial electrode is connected with the second connection line, and a second end of the second initial electrode is connected with the second initial signal line through a via.

In an exemplary implementation mode, the multiple transistors include a first transistor, a second transistor, a third transistor, a fourth transistor, a fifth transistor, a sixth transistor, and a seventh transistor; a first electrode of the first transistor is connected with the first initial signal line, a first electrode of the fourth transistor is connected with a data signal line, a first electrode of the fifth transistor is connected with a first power supply line, a first electrode of the seventh transistor is connected with the second initial signal line, a second electrode of the first transistor is connected with a first electrode of the second transistor and a gate electrode of the third transistor, a second electrode of the second transistor is connected with a second electrode of the third transistor and a first electrode of the sixth transistor, a first electrode of the third transistor is connected with a second electrode of the fourth transistor and a second electrode of the fifth transistor, and a second electrode of the sixth transistor is connected with a second electrode of the seventh transistor.

In an exemplary implementation mode, at least one dummy unit includes a dummy drive circuit, the dummy drive circuit at least includes a storage capacitor and a first transistor to a seventh transistor, the storage capacitor includes a first electrode plate and a second electrode plate, an orthographic projection of the first electrode plate on the base substrate is at least partially overlapped with an orthographic projection of the second electrode plate on the base substrate, and the first electrode plate of the dummy drive circuit and the second electrode plate of the dummy drive circuit are both connected with the first power supply line.

In an exemplary implementation mode, the dummy drive circuit further includes an inter-electrode connection electrode, a second electrode of a first transistor in multiple transistors is connected with the first electrode plate through a via, a first electrode of a fifth transistor in the multiple transistors is connected with the second electrode plate through a via, and the inter-electrode connection electrode is connected with the second electrode of the first transistor and the first electrode of the fifth transistor respectively.

In an exemplary implementation mode, an active layer of the first transistor in the dummy drive circuit lacks a channel region, and an active layer of the seventh transistor in the dummy drive circuit lacks a channel region.

FIG. 8 is a schematic diagram of a structure of a first circuit region according to an exemplary embodiment of the present disclosure, and it illustrates a planar structure of eight circuit units and seven dummy units in the first circuit region. Among them, an (M−1)-th row and an (M+1)-th row are unit rows, including four circuit units and one dummy unit respectively, an M-th row is a dummy row, including five dummy units, an (N−2)-th column, an (N−1)-th column, an (N+1)-th column, and an (N+2)-th column are unit columns, including two circuit units and one dummy unit respectively, and an N-th column is a dummy column, including three dummy units.

As shown in FIG. 8, in an exemplary implementation mode, a unit row may at least include multiple circuit units arranged sequentially along a first direction X, multiple unit rows may be sequentially arranged along a second direction Y, a unit column may at least include multiple circuit units arranged sequentially along the second direction Y, and multiple unit columns may be sequentially arranged along the first direction X. At least one circuit unit may include a pixel drive circuit, the pixel drive circuit may include multiple transistors and a storage capacitor, and the pixel drive circuit is connected with a first scan signal line 21, a second scan signal line 22, a light emitting control line 23, a first initial signal line 47, a second initial signal line 31, a data signal line 51, and a first power supply line 52, respectively. In an exemplary implementation mode, the first scan signal line 21 and the second scan signal line 22 are configured to receive a first scan signal and a second scan signal respectively, the light emitting control line 23 is configured to receive a light emitting control signal, the data signal line 51 is configured to receive a data signal, the first power supply line 52 is configured to receive a first power supply signal, the first initial signal line 47 and the second initial signal line 31 are configured to receive a first initial signal and a second initial signal respectively, the first initial signal may be configured to initialize (reset) a first electrode plate of the storage capacitor, and a second initial signal may be configured to initialize (reset) an anode of a light emitting device.

In an exemplary implementation mode, multiple transistors in the pixel drive circuit may include a first transistor T1, a second transistor T2, a third transistor T3, a fourth transistor T4, a fifth transistor T5, a sixth transistor T6, and a seventh transistor T7. A first electrode of the first transistor T1 is connected with the first initial signal line 47, a first electrode of the fourth transistor T4 is connected with the data signal line 51, a first electrode of the fifth transistor T5 is connected with the first power supply line 52, a first electrode of the seventh transistor T7 is connected with the second initial signal line 31, a second electrode of the first transistor T1 is connected with a first electrode of the second transistor T2 and a gate electrode of the third transistor T3, a second electrode of the second transistor T2 is connected with a second electrode of the third transistor T3 and a first electrode of the sixth transistor T6, a first electrode of the third transistor T3 is connected with a second electrode of the fourth transistor T4 and a second electrode of the fifth transistor T5, and a second electrode of the sixth transistor T6 is connected with a second electrode of the seventh transistor T7.

In an exemplary implementation mode, the pixel drive circuit may further include an anode connection electrode 54, the anode connection electrode 54 is connected with the second electrode of the sixth transistor T6 and the second electrode of the seventh transistor T7 respectively, and an orthographic projection of the anode connection electrode 54 on the base substrate is at least partially overlapped with an orthographic projection of the first initial signal line 47 on the base substrate.

In an exemplary implementation mode, the anode connection electrode 54 may include a first electrode, a second electrode, and a third electrode, a first end of the first electrode is connected with the second electrode of the sixth transistor T6 through a via, after a second end of the first electrode extends along an opposite direction of the first direction X, the second end of the first electrode is connected with a first end of the second electrode, after a second end of the second electrode extends along an opposite direction of the second direction Y, the second end of the second electrode is connected with a first end of the third electrode, a second end of the third electrode extends along the first direction X, the second end of the third electrode is connected with the second electrode of the seventh transistor T7 through a via, and an orthographic projection of the second electrode on the base substrate is at least partially overlapped with the orthographic projection of the first initial signal line 47 on the base substrate.

In an exemplary implementation mode, in a plane perpendicular to the display substrate, the drive circuit layer may at least include a semiconductor layer, a first conductive layer, a second conductive layer, a third conductive layer, and a fourth conductive layer that are sequentially disposed on the base substrate; the semiconductor layer at least includes active layers of multiple transistors, the first conductive layer may at least include gate electrodes of multiple transistors and a first electrode plate of a storage capacitor, the second conductive layer may at least include a first connection line 60 and a second electrode plate of the storage capacitor, the third conductive layer may at least include the first initial signal line 47 and a first initial electrode 70, and the fourth conductive layer may at least include the data signal line 51 and the first power supply line 52.

In an exemplary implementation mode, the drive circuit layer may include a first insulation layer, a second insulation layer, a third insulation layer, a fourth insulation layer, and a first planarization layer. The first insulation layer is disposed between the base substrate and the semiconductor layer, the second insulation layer is disposed between the semiconductor layer and the first conductive layer, the third insulation layer is disposed between the first conductive layer and the second conductive layer, the fourth insulation layer is disposed between the second conductive layer and the third conductive layer, and the first planarization layer is disposed between the third conductive layer and the fourth conductive layer.

In an exemplary implementation mode, a shape of the first connection line 60 may be a line shape of which a main body portion extends along the first direction X, and a shape of the first initial signal line 47 may be a line shape of which a main body portion extends along the second direction Y. The first initial signal line 47 and the first connection line 60 are connected with each other through the first initial electrode 70 to form an initial signal line with a mesh structure. In the present disclosure, A extends along a B direction means that A may include a main portion and a secondary portion connected with the main portion, the main portion is a line, a line segment, or a strip-shaped body, the main portion extends along the B direction, and a length of the main portion extends along the B direction is greater than a length of the secondary portion extends along another direction.

FIG. 9 is a schematic diagram of an initial signal line with a mesh structure in a first circuit region according to an exemplary embodiment of the present disclosure, and an arrangement of circuit units and dummy units is the same as an arrangement shown in FIG. 8. As shown in FIG. 9, in an exemplary implementation mode, a first initial signal line 47 may be disposed in each unit column and each dummy column, a first connection line 60 may be disposed in a dummy row, and a second initial signal line 31 may be disposed in each unit row.

In an exemplary implementation mode, a first initial electrode 70 may be disposed in at least one dummy unit in a dummy row, a first end of the first initial electrode 70 is directly connected with a first initial signal line 47 in the dummy unit, a second end of the first initial electrode 70 is connected with a first connection line 60 in the dummy unit where the first initial electrode 70 is located through a via and a connection block, a connection of a first initial signal line 47 extending along a second direction Y with a first connection line 60 extending along a first direction X is achieved, so that the first initial signal line 47 and the first connection line 60 form a mesh structure in a display region for transmitting a first initial signal, not only a resistance of the first initial signal line is effectively reduced, a voltage drop of the first initial voltage is reduced, but also uniformity of the first initial voltage in a display substrate is effectively improved, display uniformity is effectively improved, and display character and display quality are improved.

In an exemplary implementation mode, the first initial signal line 47 and the first initial electrode 70 may be disposed in a same layer and formed synchronously through a same patterning process and have an integral structure connected with each other.

In an exemplary implementation mode, the first initial electrode 70 may be connected with a first region of a seventh active layer through a via, and the seventh active layer is an active layer of a seventh transistor T7.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and inkjet printing. Etching may be any one or more of dry etching and wet etching, which is not limited in the present disclosure. A "thin film" refers to a layer of thin film made of a material on a base substrate through a process such as deposition and coating. If the "thin film" does not need a patterning process in an entire manufacturing process, the "thin film" may also be called a "layer". If the "thin film" needs a patterning process in an entire manufacturing process, it is called a "thin film" before the patterning process, and called a "layer" after the patterning process. The "layer" after the patterning process includes at least one "pattern". "A and B being disposed in a same layer" mentioned in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B is within a range of an orthographic projection of A" or "an orthographic projection of A contains an orthographic projection of B" refers to that a boundary of the orthographic projection of B falls within a range of a boundary of the orthographic projection of A, or a boundary of the orthographic projection of A is overlapped with a boundary of the orthographic projection of B.

In an exemplary implementation mode, taking eight circuit units and seven dummy units in a first circuit region as an example, a preparation process of a drive circuit layer may include following operations.

(11) A pattern of a semiconductor layer is formed. In an exemplary implementation mode, forming the pattern of the semiconductor layer may include: depositing sequentially a first insulation thin film and a semiconductor thin film on a base substrate, and patterning the semiconductor thin film through a patterning process to form a first insulation layer covering the base substrate and the semiconductor layer disposed on the first insulation layer, as shown in FIG. 10.

In an exemplary implementation mode, a semiconductor layer of a circuit unit may include a first active layer 11 of a first transistor T1 to a seventh active layer 17 of a seventh transistor T7, and the first active layer 11 to a sixth active layer 16 are of an integral structure connected with each other. The seventh active layer 17 may be disposed separately.

In an exemplary implementation mode, a first active layer 11, a second active layer 12, a fourth active layer 14, and a seventh active layer 17 in a circuit unit in an (M−1)-th row are located on a side of a third active layer 13 of the present circuit unit away from a circuit unit in an M-th row, the first active layer 11 and the seventh active layer 17 are located on a side of the second active layer 12 and the fourth active layer 14 away from the third active layer 13, and a fifth active layer 15 and a sixth active layer 16 in the circuit unit in the (M−1)-th row are located on a side of the third active layer 13 close to the circuit unit in the M-th row.

In an exemplary implementation mode, the first active layer 11 may have an "n" shape, the second active layer 12, the fifth active layer 15, and the sixth active layer 16 may have an "L" shape, the third active layer 13 may have a shape of a Chinese character "几", the fourth active layer 14 and the seventh active layer 17 may have an "I" shape.

In an exemplary implementation mode, an active layer of each transistor may include a first region, a second region, and a channel region located between the first region and the second region. In an exemplary implementation mode, a second region 11-2 of the first active layer 11 also serves as a first region 12-1 of the second active layer 12; a first region 13-1 of the third active layer 13 also serves as a second region 14-2 of the fourth active layer 14 and a second region 15-2 of the fifth active layer 15; a second region 13-2 of the third active layer 13 also serves as a second region 12-2 of the second active layer 12 and a first region 16-1 of the sixth active layer 16; a first region 11-1 of the first active layer 11, a first region 14-1 of the fourth active layer 14, a first region 15-1 of the fifth active layer 15, a second region 16-2 of the sixth active layer 16, a first region 17-1 of the seventh active layer 17, and a second region 17-2 of the seventh active layer 17 are separately provided.

In an exemplary implementation mode, a semiconductor layer of a dummy unit and the semiconductor layer of the circuit unit may be substantially the same, except that a fracture 18 is provided between a first region 11-1 of a first active layer 11 and a second region 11-2 of the first active layer 11 of the dummy unit, and a fracture 18 is provided between a first region 17-1 of a seventh active layer 17 and a second region 17-2 of the seventh active layer 17.

In an exemplary implementation mode, a position of a fracture 18 may correspond to a position of a second scan signal line subsequently formed, so that a first active layer 11 and a seventh active layer 17 only have a first region and a second region and do not have a channel region, that is, an active layer of a first transistor lacks a channel region, and an active layer of a seventh transistor lacks a channel region, the first transistor and the seventh transistor of a dummy unit cannot perform signal transmission, forming a dummy first transistor and a dummy seventh transistor. In the present disclosure, by providing a first active layer and a seventh active layer disconnected in a dummy unit, a first scan signal line, a second scan signal line, and/or a light emitting control signal line formed subsequently in the dummy unit may have a flexible connection structure and may be more freely connected to a relevant Direct Current (DC) signal. For example, a first scan signal line, a second scan signal line, and a light emitting control signal line in an M-th row may be connected with a bezel power supply lead line in a bezel region, thereby a load of transmitting a power supply signal is greatly reduced, which is beneficial to improvement of display uniformity.

(12) A pattern of a first conductive layer is formed. In an exemplary implementation mode, forming the pattern of the first conductive layer may include: depositing sequentially a second insulation thin film and a first conductive thin film on the base substrate on which the aforementioned pattern is formed, and patterning the first conductive thin film through a patterning process to form a second insulation layer that covers the pattern of the semiconductor layer and form the pattern of the first conductive layer disposed on the second insulation layer, as shown in FIG. 11*a* and FIG. 11*b*, and FIG. 11*b* is a planar schematic diagram of the first conductive layer in FIG. 11*a*. In an exemplary implementation mode, the first conductive layer may be referred to as a first gate metal (GATE 1) layer.

In an exemplary implementation mode, a pattern of a first conductive layer of a circuit unit may at least include a first scan signal line 21, a second scan signal line 22, a light emitting control line 23, and a first electrode plate 24 of a storage capacitor.

In an exemplary implementation mode, the first electrode plate 24 of the storage capacitor may be in a shape of a rectangle, and chamfers may be provided at corners of the rectangle. An orthographic projection of the first electrode plate 24 on the base substrate is at least partially overlapped with an orthographic projection of a third active layer of a third transistor T3 on the base substrate. In an exemplary implementation mode, the first electrode plate 24 may serve as one electrode plate of the storage capacitor and a gate electrode of the third transistor T3 simultaneously.

In an exemplary implementation mode, the first scan signal line 21, the second scan signal line 22, and the light emitting control line 23 may be in a line shape of which a main body portion extends along a first direction X. A first scan signal line 21 and a second scan signal line 22 in a circuit unit in an (M−1)-th row may be located on a side of a first electrode plate 24 of the present circuit unit away from a circuit unit in an M-th row, the second scan signal line 22 is located on a side of the first scan signal line 21 of the present circuit unit away from the first electrode plate 24, and a light emitting control line 23 may be located on a side of the first electrode plate 24 of the present circuit unit close to the circuit unit in the M-th row.

In an exemplary implementation mode, a first scan signal line 21 of a circuit unit is provided with a gate electrode block 21-1 protruding toward one side of a second scan signal line 22, and a region in which the first scan signal line 21 and the gate electrode block 21-1 are overlapped with a second active layer serves as a gate electrode of a second transistor T2 to form a second transistor T2 with a double gate structure.

In an exemplary implementation mode, a region in which a first scan signal line 21 is overlapped with a fourth active layer serves as a gate electrode of a fourth transistor T4. A region in which a second scan signal line 22 is overlapped with a first active layer serves as a gate electrode of a first transistor T1 with a double gate structure, and a region in which the second scan signal line 22 is overlapped with a seventh active layer serves as a gate electrode of a seventh transistor T7. A region in which a light emitting control line 23 is overlapped with a fifth active layer serves as a gate electrode of a fifth transistor T5, and a region in which the light emitting control line 23 is overlapped with a sixth active layer serves as a gate electrode of a sixth transistor T6.

In an exemplary implementation mode, a pattern of a first conductive layer of a dummy unit and a pattern of a first conductive layer of a circuit unit may be substantially the same, a difference is that a second scan signal line 22 is overlapped with a notch of a first active layer and a notch of a seventh active layer, the first active layer and the seventh active layer are an active layer of a first transistor T1 and an active layer of a seventh transistor T7 respectively, and overlapping regions form a gate electrode of a dummy first transistor T1 and a gate electrode of a dummy seventh transistor T7 respectively.

In an exemplary implementation mode, first scan signal line 21*s*, second scan signal lines 22, and light emitting control lines 23 in an (M−1)-th row and an (M+1)-th row are respectively connected with a gate drive circuit in a third circuit region 130, and a corresponding scan signal and a corresponding light emitting control signal are supplied by the gate drive circuit. A first scan signal line 21, a second scan signal line 22, and a light emitting control line 23 in the M-th row (dummy row) may be used as constant voltage signal lines, may extend through the third circuit region 130 of the display region to a left bezel and/or a right bezel of a bezel region, and are connected with a bezel power supply lead line provided in the left bezel and/or the right bezel. In an exemplary implementation mode, the bezel power supply lead line may be configured to transmit a high voltage power supply signal (VDD) or may be configured to transmit a low voltage power supply signal (VSS). The present disclosure may greatly reduce a load of transmitting a high voltage power supply signal or a low voltage power supply signal by connecting a signal line of a dummy row with a bezel power supply lead line in a bezel region, which is beneficial to improvement of display uniformity.

In an exemplary implementation mode, after the pattern of the first conductive layer is formed, the semiconductor layer may be subjected to a conductive treatment by using the first conductive layer as a shield. The semiconductor layer in a region, which is shielded by the first conductive layer, forms channel regions of a first transistor T1 to a seventh transistor T7, and the semiconductor layer in a region, which is not shielded by the first conductive layer, is made to be conductive, that is, first regions and second regions of a first active layer to a seventh active layer are all made to be conductive.

(13) A pattern of a second conductive layer is formed. In an exemplary implementation mode, forming the pattern of the second conductive layer may include: depositing sequentially a third insulation thin film and a second conductive thin film on the base substrate on which the aforementioned patterns are formed, and patterning the second conductive thin film through a patterning process to form a third insulation layer that covers the first conductive layer and form the pattern of the second conductive layer disposed on the third insulation layer, as shown in FIG. 12*a* and FIG. 12*b*, and FIG. 12*b* is a planar schematic diagram of the second conductive layer in FIG. 12*a*. In an exemplary implementation mode, the second conductive layer may be referred to as a second gate metal (GATE 2) layer.

In an exemplary implementation mode, a pattern of a second conductive layer of a circuit unit at least includes a second initial signal line 31, a connection block 32, a second electrode plate 33 of a storage capacitor, and an electrode plate connection line 34.

In an exemplary implementation mode, the second initial signal line 31 may be in a line shape of which a main body portion extends along the first direction X. A second initial signal line 31 in a circuit unit in an (M−1)-th row may be located on a side of a second scan signal line 22 of the present circuit unit away from a circuit unit in an M-th row, and the second initial signal line 31 is configured to be connected with a first region of a seventh active layer through a first electrode of a seventh transistor T7 which is subsequently formed.

In an exemplary implementation mode, a connection block 32 of a circuit unit may have a rectangular shape, disposed on a side of a second initial signal line 31 close to a second scan signal line 22, and connected with the second initial signal line 31. In an exemplary implementation mode, a connection block 32 is configured to be connected with a sixth connection electrode formed subsequently, so as to achieve that a second initial signal line 31 inputs a second initial signal to a first electrode of a seventh transistor T7.

In an exemplary implementation mode, the second initial signal line 31 and the connection block 32 may be of an integral structure connected with each other.

In an exemplary implementation mode, a contour shape of the second electrode plate 33 may be a shape of a rectangle, corners of the rectangle may be provided with chamfers, an orthographic projection of the second electrode plate 33 on the base substrate is at least overlapped with an orthographic projection of the first electrode plate 24 on the base substrate, the second electrode plate 33 serves as another electrode plate of the storage capacitor, and the first electrode plate 24 and the second electrode plate 33 constitute a storage capacitor of a pixel drive circuit.

In an exemplary implementation mode, the second electrode plate 33 is provided with an opening 35, and the opening 35 may be located in a middle of the second electrode plate 33. The opening 35 may be rectangular, so that the second electrode plate 33 forms an annular structure. The opening 35 exposes the third insulation layer covering the first electrode plate 24, and an orthographic projection of the first electrode plate 24 on the base substrate contains an orthographic projection of the opening 35 on the base substrate. In an exemplary implementation mode, the opening 35 is configured to accommodate a first via subsequently formed, the first via is located in the opening 35 and exposes the first electrode plate 24, so that a second electrode of a first transistor T1 subsequently formed is connected with the first electrode plate 24.

In an exemplary implementation mode, the electrode plate connection line 34 may be provided on a side of the second electrode plate 33 in the first direction X or in an opposite direction of the first direction X, a first end of the electrode plate connection line 34 is connected with the second electrode plate 33 of the present circuit unit, and a second end of the electrode plate connection line 34 extends along the first direction X or the opposite direction of the first direction X and is connected with a second electrode plate 33 of an adjacent circuit unit, the electrode plate connection line 34 is configured to enable second electrode plates of adjacent circuit units in a unit row to be connected with each other. In an exemplary implementation mode, the electrode plate connection line 34 enables second electrode plates of multiple circuit units in a unit row to form an integral structure connected with each other, the second electrode plates with the integral structure may be multiplexed as a power supply signal line, which ensures that multiple second electrode plates in a unit row have a same potential, which is beneficial to improve uniformity of a panel, avoiding poor display of the display substrate and ensuring a display effect of the display substrate.

In an exemplary implementation mode, a pattern of a second conductive layer of a dummy unit and a pattern of a second conductive layer of a circuit unit may be substantially the same, a difference is that a pattern of a second conductive layer of a dummy unit in an M-th row includes a first connection line 60, a position and a shape of the first connection line 60 in the dummy unit may be substantially the same as a position and a shape of a second initial signal line 31 in the circuit unit.

In an exemplary implementation mode, a connection block 32 of the dummy unit in the M-th row may be in a rectangular shape, disposed on a side of the first connection line 60 close to a second scan signal line 22, and connected with the first connection line 60. In an exemplary implementation mode, the connection block 32 is configured to be connected with a first initial electrode subsequently formed, so as to achieve a connection between the first connection line 60 and a first initial signal line.

A shape of the first connection line 60 of the dummy unit in the M-th row may be a line shape of which a main body portion extends along the first direction X. The first connection line 60 may be located on a side of the second scan signal line 22 of the present dummy unit away from a first scan signal line 21, and the first connection line 60 is configured to be connected with the first initial signal line through the first initial electrode subsequently formed.

(14) A pattern of a fourth insulation layer is formed. In an exemplary implementation mode, forming the pattern of the fourth insulation layer may include: depositing a fourth insulation thin film on the base substrate on which the aforementioned patterns are formed, and patterning the fourth insulation thin film through a patterning process, to form the fourth insulation layer covering the second conductive layer, wherein multiple vias are provided on the fourth insulation layer, as shown in FIG. 13.

In an exemplary implementation mode, multiple vias of a circuit unit may at least include: a first via V1, a second via V2, a third via V3, a fourth via V4, a fifth via V5, a sixth via V6, a seventh via V7, an eighth via V8, a ninth via V9, and a tenth via V10.

In an exemplary implementation mode, an orthographic projection of the first via V1 on the base substrate may be located within a range of an orthographic projection of the opening 35 of the second electrode plate 33 on the base substrate, the fourth insulation layer and the third insulation layer in the first via V1 are etched away to expose a surface of the first electrode plate 24, and the first via V1 is configured such that a second electrode of a first transistor T1 subsequently formed is connected with the first electrode plate 24 through the via.

In an exemplary implementation mode, an orthographic projection of the second via V2 on the base substrate may be located within a range of an orthographic projection of the second electrode plate 33 on the base substrate, the fourth insulation layer in the second via V2 is etched away to expose a surface of the second electrode plate 33, and the second via V2 is configured such that a first electrode of a fifth transistor subsequently formed is connected with the second electrode plate 33 through the via. In an exemplary implementation mode, the second via V2 as a power supply via may be plural, and multiple second vias V2 may be arranged sequentially along the second direction Y, thereby increasing connection reliability.

In an exemplary implementation mode, an orthographic projection of the third via V3 on the base substrate may be located within a range of an orthographic projection of the first region of the fifth active layer on the base substrate. The fourth insulation layer, the third insulation layer, and the second insulation layer in the third via V3 are etched away to expose a surface of the first region of the fifth active layer, and the third via V3 is configured such that a first electrode of a fifth transistor subsequently formed is connected with the first region of the fifth active layer through the via.

In an exemplary implementation mode, an orthographic projection of the fourth via V4 on the base substrate may be located within a range of an orthographic projection of the second region of the sixth active layer on the base substrate. The fourth insulation layer, the third insulation layer, and the second insulation layer in the fourth via V4 are etched away to expose a surface of the second region of the sixth active layer, the fourth via V4 is configured such that a second electrode of a sixth transistor T6 subsequently formed is connected with the second region of the sixth active layer through the via.

In an exemplary implementation mode, an orthographic projection of the fifth via V5 on the base substrate may be located within a range of an orthographic projection of the first region of the fourth active layer on the base substrate. The fourth insulation layer, the third insulation layer, and the second insulation layer in the fifth via V5 are etched away to expose a surface of the first region of the fourth active layer, and the fifth via V5 is configured such that a first electrode of a fourth transistor subsequently formed is connected with the first region of the fourth active layer through the via.

In an exemplary implementation mode, an orthographic projection of the sixth via V6 on the base substrate may be located within a range of an orthographic projection of the second region of the first active layer (also the first region of the second active layer) on the base substrate. The fourth insulation layer, the third insulation layer, and the second insulation layer in the sixth via V6 are etched away to expose a surface of the second region of the first active layer, the sixth via V6 is configured such that a second electrode of a first transistor T1 (also a first electrode of a second transistor T2) subsequently formed is connected with the first region of the first active layer through the via.

In an exemplary implementation mode, an orthographic projection of the seventh via V7 on the base substrate may be located within a range of an orthographic projection of the first region of the seventh active layer on the base substrate. The fourth insulation layer, the third insulation layer, and the second insulation layer in the seventh via V7 are etched away to expose a surface of the first region of the seventh active layer, and the seventh via V7 is configured such that a first electrode of a seventh transistor T7 subsequently formed is connected with the first region of the seventh active layer through the via.

In an exemplary implementation mode, an orthographic projection of the eighth via V8 on the base substrate is within a range of an orthographic projection of the second region of the seventh active layer on the base substrate. The fourth insulation layer, the third insulation layer, and the second insulation layer in the eighth via V8 are etched away to expose a surface of the second region of the seventh active layer, the eighth via V8 is configured such that a second electrode of a seventh transistor T7 subsequently formed is connected with the second region of the seventh active layer through the via.

In an exemplary implementation mode, an orthographic projection of the ninth via V9 on the base substrate is located within a range of an orthographic projection of the connection block 32 on the base substrate, the fourth insulation layer in the ninth via V9 is etched away to expose a surface of the connection block 32, and the ninth via V9 is configured such that a first electrode of a seventh transistor T7 subsequently formed is connected with the connection block 32 through the via.

In an exemplary implementation mode, an orthographic projection of the tenth via V10 on the base substrate is within a range of an orthographic projection of the first region of the first active layer on the base substrate. The fourth insulation layer, the third insulation layer, and the second insulation layer in the tenth via V10 are etched away to expose a surface of the first region of the first active layer, and the tenth via V10 is configured such that a first initial signal line subsequently formed is connected with the first region of the first active layer through the via.

In an exemplary implementation mode, patterns of multiple vias of a dummy unit and a pattern of a second conductive layer of a circuit unit may be substantially the same, a difference is that a seventh via V7 of a dummy unit in an M-th row is configured to connect a first initial electrode subsequently formed with the connection block 32 through the via, and the ninth via V9 is configured to connect the first initial electrode subsequently formed with the first region of the seventh active layer through the via, so as to achieve a connection between a first initial signal line and a first connection line.

(15) A pattern of a third conductive layer is formed. In an exemplary implementation mode, forming the third conductive layer may include: depositing a third conductive thin film on the base substrate on which the aforementioned patterns are formed, and patterning the third conductive thin film through a patterning process to form the third conductive layer disposed on the fourth insulation layer, as shown in FIG. 14*a* and FIG. 14*b*, and FIG. 14*b* is a planar schematic diagram of the third conductive layer in FIG. 14*a*. In an exemplary implementation mode, the third conductive layer may be referred to as a first Source-Drain metal (SD1) layer.

In an exemplary implementation mode, a third conductive layer of a circuit unit at least includes a first connection electrode 41, a second connection electrode 42, a third connection electrode 43, a fourth connection electrode 44, a fifth connection electrode 45, a sixth connection electrode 46, and a first initial signal line 47.

In an exemplary implementation mode, the first connection electrode 41 may be in a strip shape of which a main body portion extends along the second direction Y. A first end of the first connection electrode 41 is connected with the first electrode plate 24 through the first via V1, and a second end of the first connection electrode 41 is connected with the second region of the first active layer (also the first region of the second active layer) through the sixth via V6. In an exemplary implementation mode, the first connection electrode 41 may serve as both the second electrode of the first transistor T1 and the first electrode of the second transistor T2, so that the first electrode plate 24, the second electrode of the first transistor T1, the first electrode of the second transistor T2 (i.e., a second node N2 of a pixel drive circuit) have a same potential.

In an exemplary implementation mode, the second connection electrode 42 may be in a strip shape of which a main body portion extends along the second direction Y. A first end of the second connection electrode 42 is connected with the first region of the fifth active layer through the third via V3, and a second end of the second connection electrode 42 is connected with the second electrode plate 33 through multiple second vias V2. In an exemplary implementation mode, the second connection electrode 42 may serve as the first electrode of the fifth transistor T5, so that the first electrode of the fifth transistor T5 and the second electrode plate 33 have a same potential, and the second connection electrode 42 is configured to be connected with a first power supply line subsequently formed.

In an exemplary implementation mode, a shape of the third connection electrode 43 may be a polygonal shape, and the third connection electrode 43 may be connected with the second region of the seventh active layer through the eighth via V8. In an exemplary implementation mode, the third connection electrode 43 may serve as the second electrode of the seventh transistor T7, and the third connection electrode 43 is configured to be connected with an anode connection electrode subsequently formed.

In an exemplary implementation mode, a shape of the fourth connection electrode 44 may be a polygonal shape, and the fourth connection electrode 44 may be connected with the second region of the sixth active layer through the fourth via V4. In an exemplary implementation mode, the fourth connection electrode 44 may serve as the second electrode of the sixth transistor T6, and the fourth connection electrode 44 is configured to be connected with the anode connection electrode subsequently formed.

In an exemplary implementation mode, a shape of the fifth connection electrode 45 may be a strip shape of which a main body portion extends along the second direction Y, and the fifth connection electrode 45 may be connected with the first region of the fourth active layer through the fifth via V5. In an exemplary implementation mode, the fifth connection electrode 45 may serve as the first electrode of the fourth transistor T4, and the fifth connection electrode 45 is configured to be connected with a data signal line subsequently formed.

In an exemplary implementation mode, a shape of the sixth connection electrode 46 may be a strip shape of which a main body portion extends along the first direction X. A first end of the sixth connection electrode 46 is connected with the connection block 32 through the ninth via V9, and a second end of the sixth connection electrode 46 is connected with the first region of the seventh active layer through the seventh via V7. Since the connection block 32 is connected with the second initial signal line 31, thus a connection between the second initial signal line 31 and the first region of the seventh active layer is achieved. In an exemplary implementation mode, the sixth connection electrode 46 may serve as the first electrode of the seventh transistor T7, so that the second initial signal line 31 and the first electrode of the seventh transistor T7 have a same potential, achieving that the second initial signal line 31 inputs a second initial signal to the first electrode of the seventh transistor T7.

In an exemplary implementation mode, a shape of the first initial signal line 47 may be a line shape of which a main body portion extends along the second direction Y, and the first initial signal line 47 may be connected with the first region of the first active layer through the tenth via V10, achieving that the first initial signal line 47 inputs a first initial signal to the first electrode of the first transistor T1. In the present disclosure, by providing the first initial signal line 47 vertically penetrating through a display region, a first initial signal from a bonding region may be quickly transmitted to the display region, which improves an initialization speed, is more conducive to improving a refresh rate, and meets a high-frequency requirement.

In an exemplary implementation mode, a third conductive layer of a dummy unit and a third conductive layer of a circuit unit may be substantially the same, a difference is that the third conductive layer of the dummy unit further includes an inter-electrode connection electrode 48, and a third conductive layer of at least one dummy unit in an M-th row further includes a first initial electrode 70.

In an exemplary implementation mode, a shape of the inter-electrode connection electrode 48 may be a rectangular shape, a first end of the inter-electrode connection electrode 48 is connected with the first connection electrode 41, and a second end of the inter-electrode connection electrode 48 is connected with the second connection electrode 42. Since the first connection electrode 41 is connected with the first electrode plate 24 and the second connection electrode 42 is connected with the second electrode plate 33, the first electrode plate 24 and the second electrode plate 33 of the dummy unit may have a same potential through the inter-electrode connection electrode 48. Since the second connection electrode 42 is configured to be connected with the first power supply line subsequently formed, the first electrode plate 24, the second electrode plate 33, and the first power supply line of the dummy unit have a same potential, that is, the second node N2 of the pixel drive circuit has a same potential as the first power supply line, so that an influence on display due to floating of the second node N2 of the dummy unit may be eliminated, and display quality may be improved.

In an exemplary implementation mode, the first connection electrode 41, the second connection electrode 42, and the inter-electrode connection electrode 48 of the dummy unit may be of an integral structure connected with each other.

In an exemplary implementation mode, a position and a shape of a first initial electrode 70 of a dummy unit in an M-th row may be substantially the same as a position and a shape of a sixth connection electrode 46 of a circuit unit, and a difference is that the first initial electrode 70 is connected with the first initial signal line 47.

In an exemplary implementation mode, a shape of the first initial electrode 70 may be a strip shape of which a main body portion extends along the first direction X, and a first end of the first initial electrode 70 is connected with the first initial signal line 47. After a second end of the first initial electrode 70 extends along the first direction X, it is connected with the connection block 32 through the ninth via V9 on one hand, and is connected with the first region of the seventh active layer through the seventh via V7 on the other hand.

In an exemplary implementation mode, since the connection block in the M-th row is connected with a first connection line 60 in the M-th row on one hand, on the other hand, it is connected with the first initial electrode 70 through a via, while the first initial electrode 70 is connected with the first initial signal line 47, thus a connection between the first initial signal line 47 extending along the second direction Y and the first connection line 60 extending along the first direction X is achieved, so that the first initial signal line 47 and the first connection line 60 form a mesh structure for transmitting a first initial signal in the display region, not only a resistance of the first initial signal line is effectively reduced, a voltage drop of the first initial signal is reduced, but also uniformity of the first initial signal in the display substrate is effectively improved, display uniformity is effectively improved, and display character and display quality are improved.

In an exemplary implementation mode, the first initial electrode 70 and the first initial signal line 47 may be of an integral structure connected with each other.

(16) A pattern of a first planarization layer is formed. In an exemplary implementation mode, forming the pattern of the first planarization layer may include: coating a first planarization thin film on the base substrate on which the aforementioned patterns are formed, patterning the first planarization thin film through a patterning process to form the first planarization layer covering the third conductive layer, wherein the first planarization layer is provided with multiple vias, as shown in FIG. 15.

In an exemplary implementation mode, multiple vias of a circuit unit at least include an eleventh via V11, a twelfth via V12, a thirteenth via V13, and a fourteenth via V14.

In an exemplary implementation mode, an orthographic projection of the eleventh via V11 on the base substrate may be located within a range of an orthographic projection of the fifth connection electrode 45 on the base substrate, the first planarization layer in the eleventh via V11 is removed to expose a surface of the fifth connection electrode 45, and the eleventh via V11 is configured such that a data signal line subsequently formed is connected with the fifth connection electrode 45 through the via.

In an exemplary implementation mode, an orthographic projection of the twelfth via V12 on the base substrate may be located within a range of an orthographic projection of the second connection electrode 42 on the base substrate, the first planarization layer in the twelfth via V12 is removed to expose a surface of the second connection electrode 42, and the twelfth via V12 is configured such that a first power supply line subsequently formed is connected with the second connection electrode 42 through the via.

In an exemplary implementation mode, an orthographic projection of the thirteenth via V13 on the base substrate may be located within a range of an orthographic projection of the fourth connection electrode 44 on the base substrate, the first planarization layer in the thirteenth via V13 is removed to expose a surface of the fourth connection electrode 44, and the thirteenth via V13 is configured such that an anode connection electrode subsequently formed is connected with the fourth connection electrode 44 through the via.

In an exemplary implementation mode, an orthographic projection of the fourteenth via V14 on the base substrate may be located within a range of an orthographic projection of the third connection electrode 43 on the base substrate, the first planarization layer in the fourteenth via V14 is removed to expose a surface of the third connection electrode 43, and the fourteenth via V14 is configured such that the anode connection electrode subsequently formed is connected with the third connection electrode 43 through the via.

In an exemplary implementation mode, patterns of multiple vias of a dummy unit and patterns of the multiple vias of the circuit unit may be substantially the same.

Figure 16A:
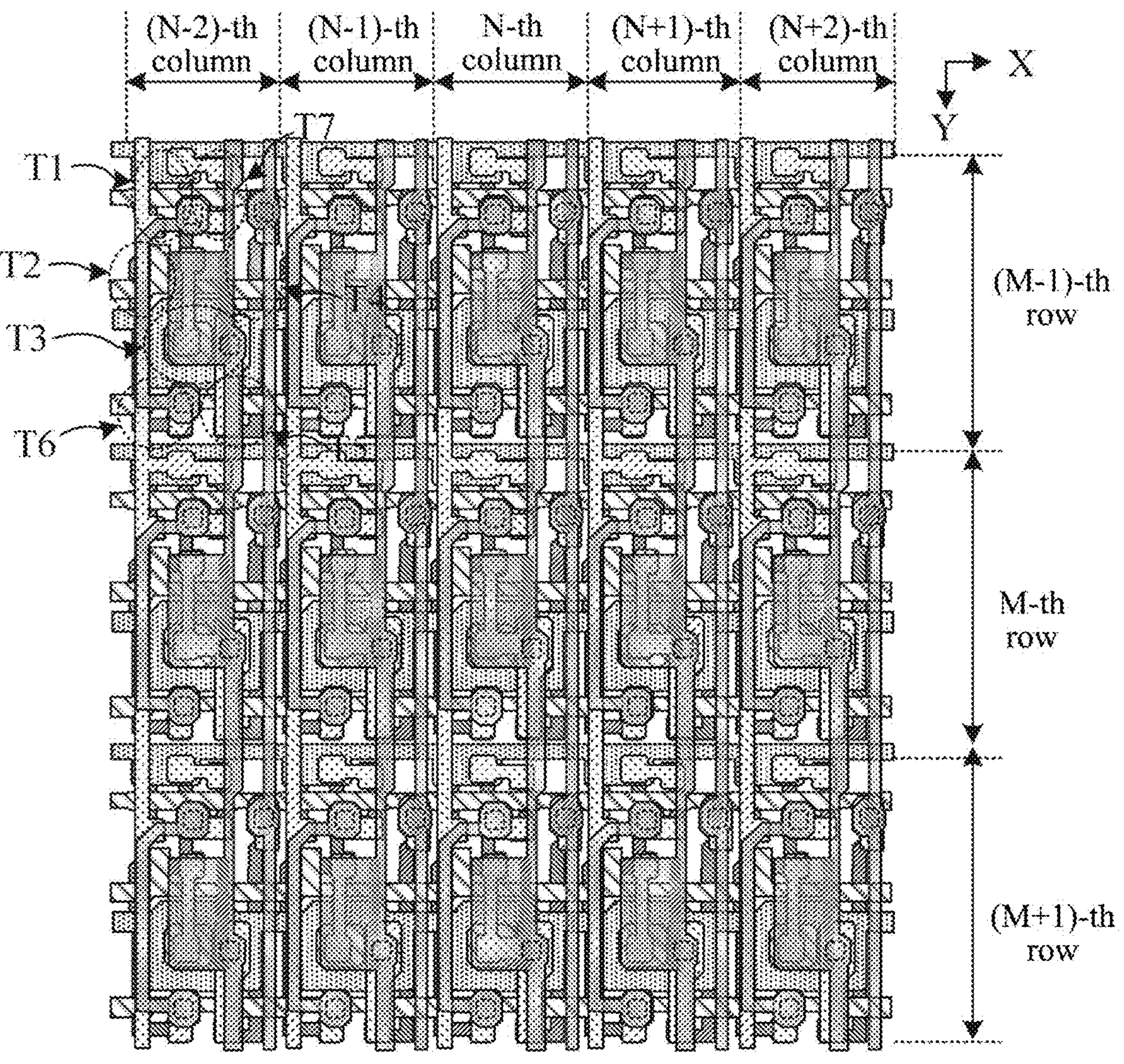
FIG. 16*a* and FIG. 16*b* are schematic diagrams of a display substrate after a pattern of a fourth conductive layer is formed according to the present disclosure.
Figure 16B:
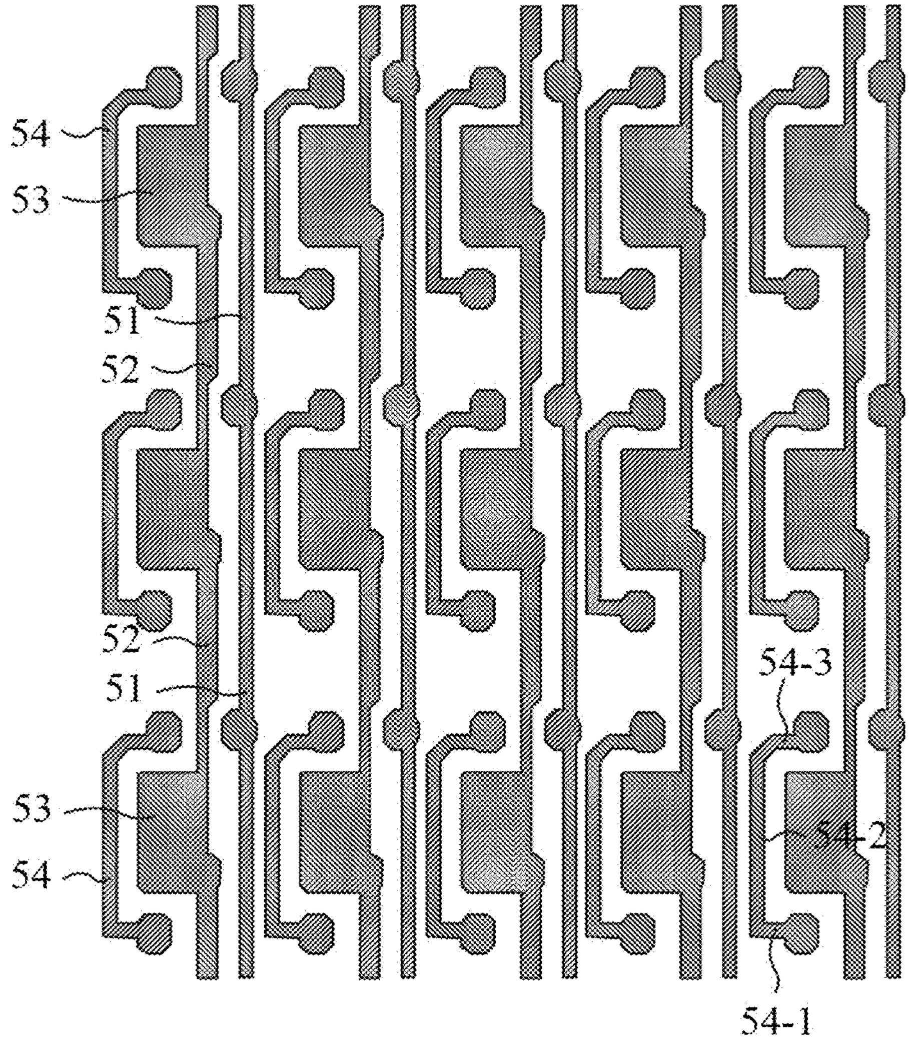

(17) A pattern of a fourth conductive layer is formed. In an exemplary implementation mode, forming the pattern of the fourth conductive layer may include: depositing a fourth conductive thin film on the base substrate on which the aforementioned patterns are formed, and patterning the fourth conductive thin film through a patterning process to form the fourth conductive layer disposed on the first planarization layer, as shown in FIG. 16*a* and FIG. 16*b*, and FIG. 16*b* is a planar schematic diagram of the fourth conductive layer in FIG. 16*a*. In an exemplary implementation mode, the fourth conductive layer may be referred to as a second Source-Drain metal (SD2) layer.

In an exemplary implementation mode, a fourth conductive layer of a circuit unit at least includes: a data signal line 51, a first power supply line 52, a shielding electrode 53, and an anode connection electrode 54.

In an exemplary implementation mode, a shape of the data signal line 51 may be a line shape of which a main body portion extends along the second direction Y, and the data signal line 51 may be connected with the fifth connection electrode 45 through the eleventh via V11. Since the fifth connection electrode 45 is connected with the first region of the fourth active layer through the via, it is achieved that the data signal line 51 writes a data signal into the first electrode of the fourth transistor T4 through the fifth connection electrode 45.

In an exemplary implementation mode, a shape of the first power supply line 52 may be a line shape of which a main body portion extends along the second direction Y, and the first power supply line 52 may be connected with the second connection electrode 42 through the twelfth via V12. Since the second connection electrode 42 is connected with the first region of the fifth active layer and the second electrode plate 33 through the via, it is achieved that the first power supply line 52 writes a first power supply signal into the first electrode of the fifth transistor T5 through the second connection electrode 42, and the second electrode plate 33 and the first power supply line 52 have a same potential.

In an exemplary implementation mode, the shielding electrode 53 may be in a rectangular shape, disposed on a side of the first power supply line 52 close to the first connection electrode 41, and connected with the first power supply line 52. An orthographic projection of the shielding electrode 53 on the base substrate is at least partially overlapped with an orthographic projection of the first connection electrode 41 on the base substrate. In an exemplary implementation mode, since the shielding electrode 53 is connected with the first power supply line 52, the shielding electrode 53 and the first power supply line 52 have a same potential, and the orthographic projection of the shielding electrode 53 on the base substrate is at least partially overlapped with the orthographic projection of the first connection electrode 41 on the base substrate, a key node (the second node N2) on the pixel drive circuit may be effectively shielded, not only may a corresponding signal (such as a data voltage jump signal) be prevented from affecting a potential of the key node of the pixel drive circuit, but also a difference of parasitic capacitances in regions where second nodes N2 are located in different circuit units may be eliminated, which improves display uniformity and improves a display effect.

In an exemplary implementation mode, a shape of the anode connection electrode 54 may be a "C" shape, a first end of the anode connection electrode 54 may be connected with the fourth connection electrode 44 through the thirteenth via V13, and a second end of the anode connection electrode 54 may be connected with the third connection electrode 43 through the fourteenth Via V14. Since the third connection electrode 43 is connected with the second region of the seventh active layer through a via, the fourth connection electrode 44 is connected with the second region of the sixth active layer through a via, so that the anode connection electrode 54 is connected with the second electrode of the sixth transistor T6 and the second electrode of the seventh transistor T7 through the third connection electrode 43 and the fourth connection electrode 44 respectively, and a homo-electrode reset is achieved. In an exemplary implementation mode, the anode connection electrode 54 is configured to be connected with an anode subsequently formed.

In an exemplary implementation mode, an orthographic projection of the anode connection electrode 54 on the base substrate is at least partially overlapped with an orthographic projection of the first initial signal line 47 on the base substrate.

In an exemplary implementation mode, the anode connection electrode 54 may include a first electrode 54-1, a second electrode 54-2, and a third electrode 54-3 connected with each other, the first electrode 54-1 and the third electrode 54-3 may be in a strip shape of which a main body portion extends along the first direction X, and the second electrode 54-2 may be in a strip shape of which a main body portion extends along the second direction Y.

In an exemplary implementation mode, a first end of the first electrode 54-1 is connected with the fourth connection electrode 44 through the thirteenth via V13, and a second end of the first electrode 54-1 is connected with a first end of the second electrode 54-2 after the second end of the first electrode 54-1 extends along a direction opposite to the first direction X (toward a direction close to the first initial signal line 47 in the present circuit unit). A second end of the second electrode 54-2 is connected with a first end of the third electrode 54-3 after the second end of the second electrode 54-2 extends along a direction opposite to the second direction Y (toward a direction close to the seventh transistor T7 in the present circuit unit). A second end of the third electrode 54-3 is connected with the third connection electrode 43 through the fourteenth via V14 after the second end of the third electrode 54-3 extends along the first direction X (toward a direction away from the first initial signal line 47 in the present circuit unit).

In an exemplary implementation mode, an orthographic projection of the second electrode 54-2 on the base substrate is at least partially overlapped with the orthographic projection of the first initial signal line 47 on the base substrate, so that the first initial signal line 47 may play a shielding role, thereby avoiding an influence of the anode connection electrode 54 on the key node in the pixel drive circuit and improving display uniformity, moreover, layout space may be fully utilized, avoiding a light transmittance being affected by disposing of the anode connection electrode 54, and improving a display effect.

In an exemplary implementation mode, data signal lines 51 of an (N−2)-th column, an (N−1)-th column, an (N+1)-th column, and an (N+2)-th column are connected with a data fan-out line in a second circuit region 120, and a data signal is provided by the data fan-out line. A data signal line 51 of an N-th column may be used as a constant voltage signal line, and the data signal line 51 of the N-th column may extend through the second circuit region 120 to a bonding region and be connected with a bonding power supply lead line in the bonding region. In an exemplary implementation mode, the bonding power supply lead line may be configured to transmit a high voltage power supply signal (VDD) or may be configured to transmit a low voltage power supply signal (VSS). In the present disclosure, by connecting a data signal line of a dummy column with the bonding power supply lead line of the bonding region, a load of transmitting a high voltage power supply signal or a low voltage power supply signal may be greatly reduced, which is beneficial to improvement of display uniformity.

In some possible exemplary implementation modes, the data signal line 51 of the N-th column may extend to an upper bezel of a bezel region and a bezel power lead line in the upper bezel, which is not limited in the present disclosure.

In an exemplary implementation mode, a pattern of a fourth conductive layer of a dummy unit and a pattern of a fourth conductive layer of a circuit unit may be substantially the same. A subsequent preparation process may include: forming a pattern of a second planarization layer, completing a drive circuit layer, and then preparing a light emitting structure layer and an encapsulation structure layer on the drive circuit layer.

In an exemplary implementation mode, forming the pattern of the second planarization layer may include: coating a second planarization thin film on the base substrate on which the aforementioned patterns are formed, patterning the second planarization thin film through a patterning process to form the second planarization layer covering the fourth conductive layer, wherein the second planarization layer is provided with multiple twenty-first vias, an orthographic projection of a twenty-first via on the base substrate may be located within a range of the orthographic projection of the anode connection electrode 54 on the base substrate, the second planarization layer in the twenty-first via is removed to expose a surface of the anode connection electrode 54, and the twenty-first via is configured such that the anode subsequently formed is connected with the anode connection electrode 54 through the via.

In an exemplary implementation mode, preparing the light emitting structure layer may include: forming a pattern of an anode, and the anode is connected with the anode connection electrode through the fourteenth via. A pattern of a pixel definition layer is formed, wherein the pixel definition layer is provided with a pixel opening exposing the anode. An organic emitting layer is formed using an evaporation or inkjet printing process, and the organic emitting layer is connected with the anode through the pixel opening. A cathode is formed, and the cathode is connected with the organic emitting layer.

In an exemplary implementation mode, the encapsulation structure layer may include a first encapsulation layer, a second encapsulation layer, and a third encapsulation layer that are stacked. The first encapsulation layer and the third encapsulation layer may be made of an inorganic material, and the second encapsulation layer may be made of an organic material. The second encapsulation layer is provided between the first encapsulation layer and the third encapsulation layer, and it may be ensured that external water vapor cannot enter the light emitting structure layer.

Thus, preparation of the display substrate including the drive circuit layer, the light emitting structure layer, and the encapsulation structure layer is completed. In a plane parallel to the display substrate, the drive circuit layer may at least include multiple circuit units and multiple dummy units, a circuit unit may include a pixel drive circuit, and the dummy unit may include a dummy drive circuit, and a first scan signal line, a second scan signal line, a light emitting control line, a data signal line, a first power supply line, a first initial signal line, and a second initial signal line that are connected with the pixel drive circuit and the dummy drive circuit.

In an exemplary implementation mode, the pixel drive circuit may at least include a first transistor to a seventh transistor, and the dummy drive circuit may at least include a first transistor to a seventh transistor. An active layer of the first transistor of the dummy drive circuit lacks a channel region, and an active layer of the seventh transistor lacks a channel region.

In an exemplary implementation mode, in a plane perpendicular to the display substrate, the drive circuit layer may include a first insulation layer, a semiconductor layer, a second insulation layer, a first conductive layer, a third insulation layer, a second conductive layer, a fourth insulation layer, a third conductive layer, a first planarization layer, a fourth conductive layer, and a second planarization layer which are stacked sequentially on the base substrate.

In an exemplary implementation mode, the base substrate may be a flexible base substrate, or may be a rigid base substrate. The rigid base substrate may be made of, but is not limited to, one or more of glass and quartz. The flexible base substrate may be made of, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary implementation mode, the flexible base substrate may include a first flexible material layer, a first inorganic material layer, a semiconductor layer, a second flexible material layer, and a second inorganic material layer which are stacked, wherein materials of the first flexible material layer and the second flexible material layer may be Polyimide (PI), Polyethylene Terephthalate (PET), or a surface treated polymer soft film, or the like. Materials of the first inorganic material layer and the second inorganic material layer may be Silicon Nitride (SiNx) or Silicon Oxide (SiOx), or the like, for improving water and oxygen resistance of the base substrate. A material of the semiconductor layer may be amorphous silicon (a-si).

In an exemplary implementation mode, the first conductive layer, the second conductive layer, the third conductive layer, and the fourth conductive layer may be made of a metal material, such as any one or more of Argentum (Ag), Copper (Cu), Aluminum (Al), and Molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. The first insulation layer, the second insulation layer, the third insulation layer, and the fourth insulation layer may be made of any one or more of Silicon Oxide (SiOx), Silicon Nitride (SiNx), and Silicon Oxynitride (SiON), and may be a single layer, a multi-layer, or a composite layer. The first insulation layer is called a buffer layer, which is used for improving water and oxygen resistance of the base substrate. The second insulation layer and the third insulation layer are called Gate Insulation (GI) layers. The fourth insulation layer is called an Interlayer Dielectric (ILD) layer. The first planarization layer and the second planarization layer may be made of an organic material such as a resin. An active layer may be made of a material such as amorphous Indium Gallium Zinc Oxide (a-IGZO), Zinc Oxynitride (ZnON), Indium Zinc Tin Oxide (IZTO), amorphous Silicon (a-Si), polycrystalline Silicon (p-Si), hexathiophene, or polythiophene. That is, the present disclosure is applicable to transistors that are manufactured based on an oxide technology, a silicon technology, or an organic matter technology.

As may be seen from the structure and the preparation process of the display substrate described above, in the display substrate provided by the present disclosure, by providing a first connection line of which a main body portion extends along a first direction in a dummy row, and the first connection line is connected with a first initial signal line of which a main body portion extends along a second direction, so that the first initial signal line transmitting a first initial signal forms a mesh structure, not only a resistance of the first initial signal line is effectively reduced, a voltage drop of a first initial voltage is reduced, but also uniformity of the first initial voltage in the display substrate is effectively improved, display uniformity is effectively improved, and display character and display quality are improved. In the present disclosure, by providing a first connection line in a dummy row, connecting some of or all of signal lines in the dummy row with a bezel power supply lead line of a bezel region, connecting a data signal line in a dummy column with a bonding power supply lead line of a bonding region, not only signal lines in the dummy row and the dummy column may be reasonably utilized to avoid waste of space in a display region, but also a load of transmitting a power supply signal is greatly reduced, which is beneficial to improvement of display uniformity.

Figure 17:
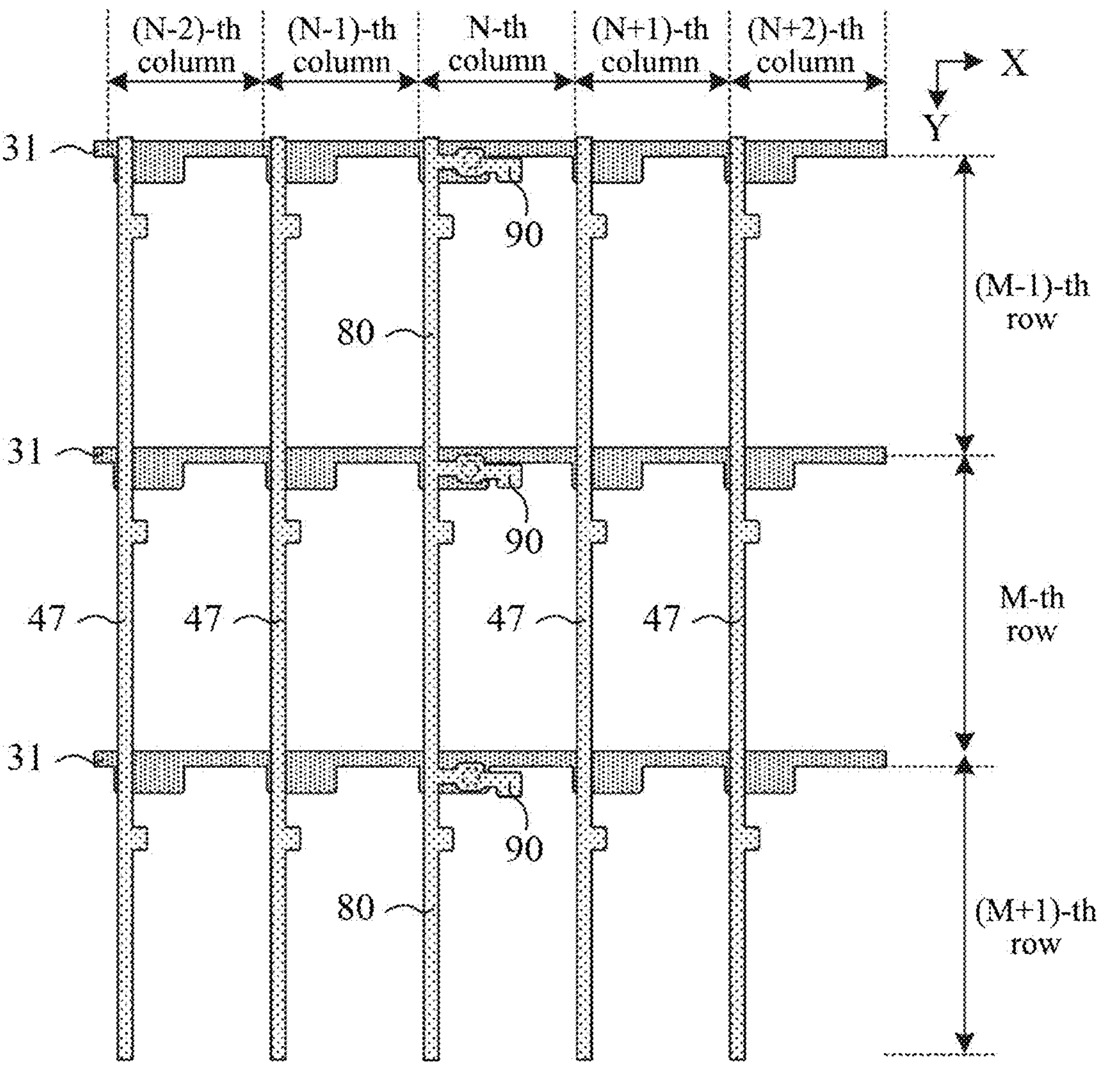
FIG. 17 is a schematic diagram of an initial signal line with another mesh structure according to an exemplary embodiment of the present disclosure.

FIG. 17 is a schematic diagram of an initial signal line with another mesh structure in the first circuit region according to an exemplary embodiment of the present disclosure, and an arrangement of circuit units and dummy units is the same as that shown in FIG. 8. As shown in FIG. 17, in an exemplary implementation mode, the second initial signal line 31 may be disposed in each unit row and dummy row, the first initial signal line 47 may be disposed in each unit column, and the second connection line 80 may be disposed in each dummy column.

In an exemplary implementation mode, the second initial electrode 90 may be disposed in at least one dummy unit in the dummy column, a first end of the second initial electrode 90 is directly connected with the second connection line 80 in the dummy unit where the second initial electrode 90 is located, a second end of the second initial electrode 90 is connected with the second initial signal line 31 in the dummy unit where the second initial electrode 90 is located through a via and a connection block, a connection between the second initial signal line 31 extending along the first direction X and the second connection line 80 extending along the second direction Y is achieved, so that the second initial signal line 31 and the second connection line 80 form a mesh structure for transmitting a second initial signal in the display region, not only a resistance of the second initial signal line is effectively reduced, a voltage drop of the second initial voltage is reduced, but also uniformity of the second initial voltage in the display substrate is effectively improved, display uniformity is effectively improved, and display character and display quality are improved.

In an exemplary implementation mode, the structure of the circuit unit in this exemplary embodiment may be substantially the same as the structure of the circuit unit in the foregoing embodiment.

In an exemplary implementation mode, the preparation process of the display substrate according to this exemplary embodiment may include following acts.

(21) Forming a pattern of a semiconductor layer, a pattern of a first conductive layer, a pattern of a second conductive layer, and a pattern of a fourth insulation layer, a preparation process and formed conductive patterns are substantially the same as those in the acts (11) to (14) of the foregoing embodiment, and a difference is that a pattern of a second conductive layer of a circuit unit in a unit row and a pattern of a second conductive layer of a dummy unit in a dummy row may each include a second initial signal line 31.

Figure 18:
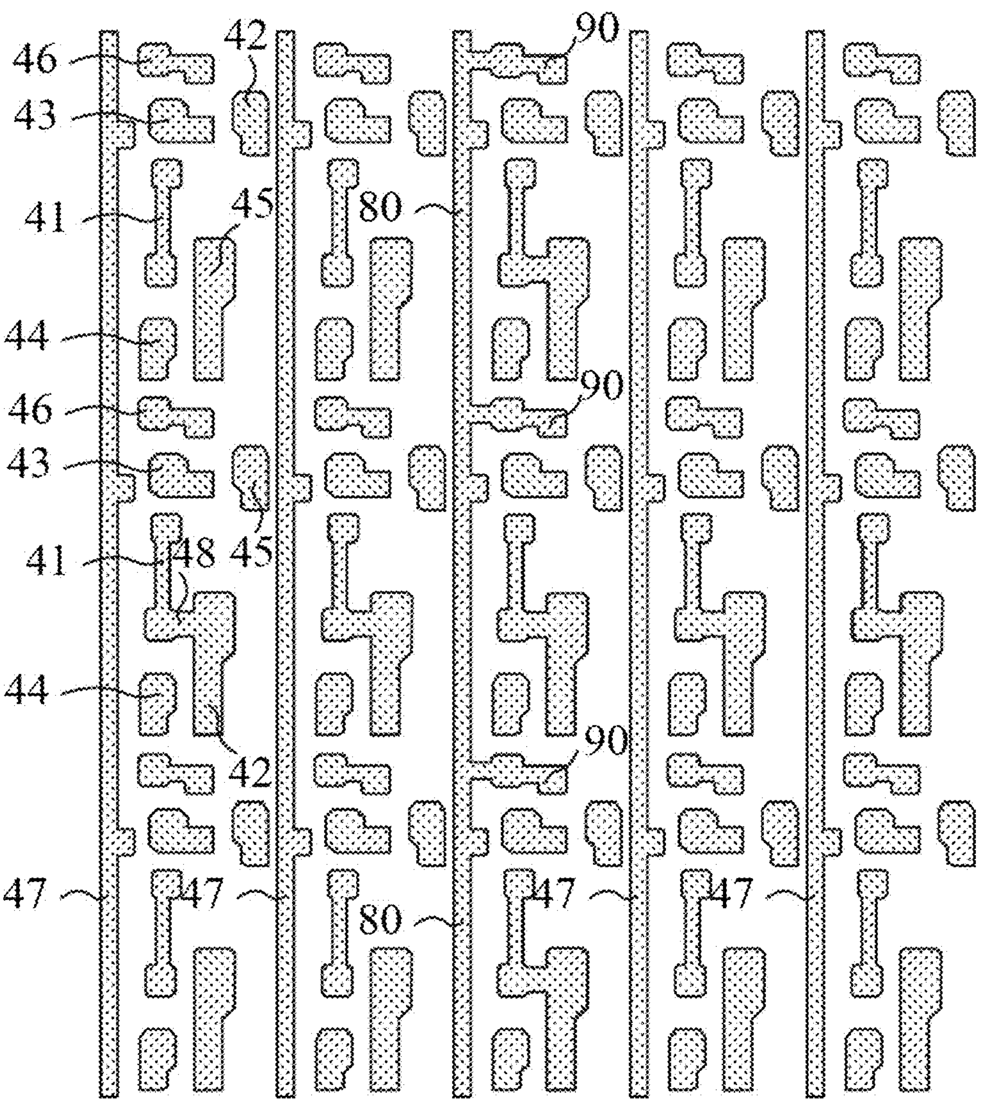
FIG. 18 is a schematic diagram of a display substrate after another pattern of a third conductive layer is formed according to the present disclosure.

(22) Forming a pattern of a third conductive layer, the pattern of the third conductive layer is substantially the same as the pattern of the third conductive layer formed in the act (15) of the foregoing embodiment, and a difference is that a third conductive layer of multiple dummy units in an N-th column may include a second connection line 80 and a second initial electrode 90, as shown in FIG. 18.

In an exemplary implementation mode, a shape of the second connection line 80 in the N-th column may be a line shape of which a main body portion extends along the second direction Y, a shape of the second initial electrode 90 of the at least one dummy unit may be a strip shape of which a main body portion extends along the first direction X, a first end of the second initial electrode 90 is connected with the second connection line 80. After a second end of the second initial electrode 90 extends along the first direction X, it is connected with a connection block through a ninth via on one hand, and is connected with a first region of a seventh active layer through a seventh via on the other hand.

In an exemplary implementation mode, since a connection block in an N-th column is connected with the second initial signal line 31 on one hand, on the other hand, it is connected with the second initial electrode 90 through a via, while the second initial electrode 90 is connected with the second connection line 80, a connection between the second initial signal line 31 extending along the first direction X and the second connection line 80 extending along the second direction Y is thus achieved, so that the second initial signal line 31 and the second connection line 80 form a mesh structure for transmitting a second initial signal in a display region, not only a resistance of the second initial signal line may be effectively reduced, a voltage drop of the second initial signal may be reduced, but also uniformity of the second initial signal in the display substrate may be effectively improved, display uniformity may be effectively improved, and display character and display quality may be improved.

In an exemplary implementation mode, the second initial electrode 90 and the second connection line 80 may be of an integral structure connected with each other.

In an exemplary implementation mode, the second connection line 80 may be connected with a first region of a first active layer through a via, so as to achieve that the second initial signal is input into a first electrode of a first transistor T1.

(23) Forming a pattern of a first planarization layer and a pattern of a fourth conductive layer, a preparation process and formed patterns are substantially the same as those in the acts (16) to (17) of the foregoing embodiment, and will not be repeated here.

In the display substrate provided by the exemplary embodiment of the present disclosure, by providing the second connection line of which the main body portion extends along the second direction in the dummy column, and the second connection line is connected with the second initial signal line of which the main body portion extends along the first direction, so that the initial signal line transmitting the second initial signal forms a mesh structure, not only a resistance of the second initial signal line is effectively reduced, a voltage drop of a second initial voltage is reduced, but also uniformity of the second initial voltage in the display substrate is effectively improved, display uniformity is effectively improved, and display character and display quality are improved.

Figure 19:
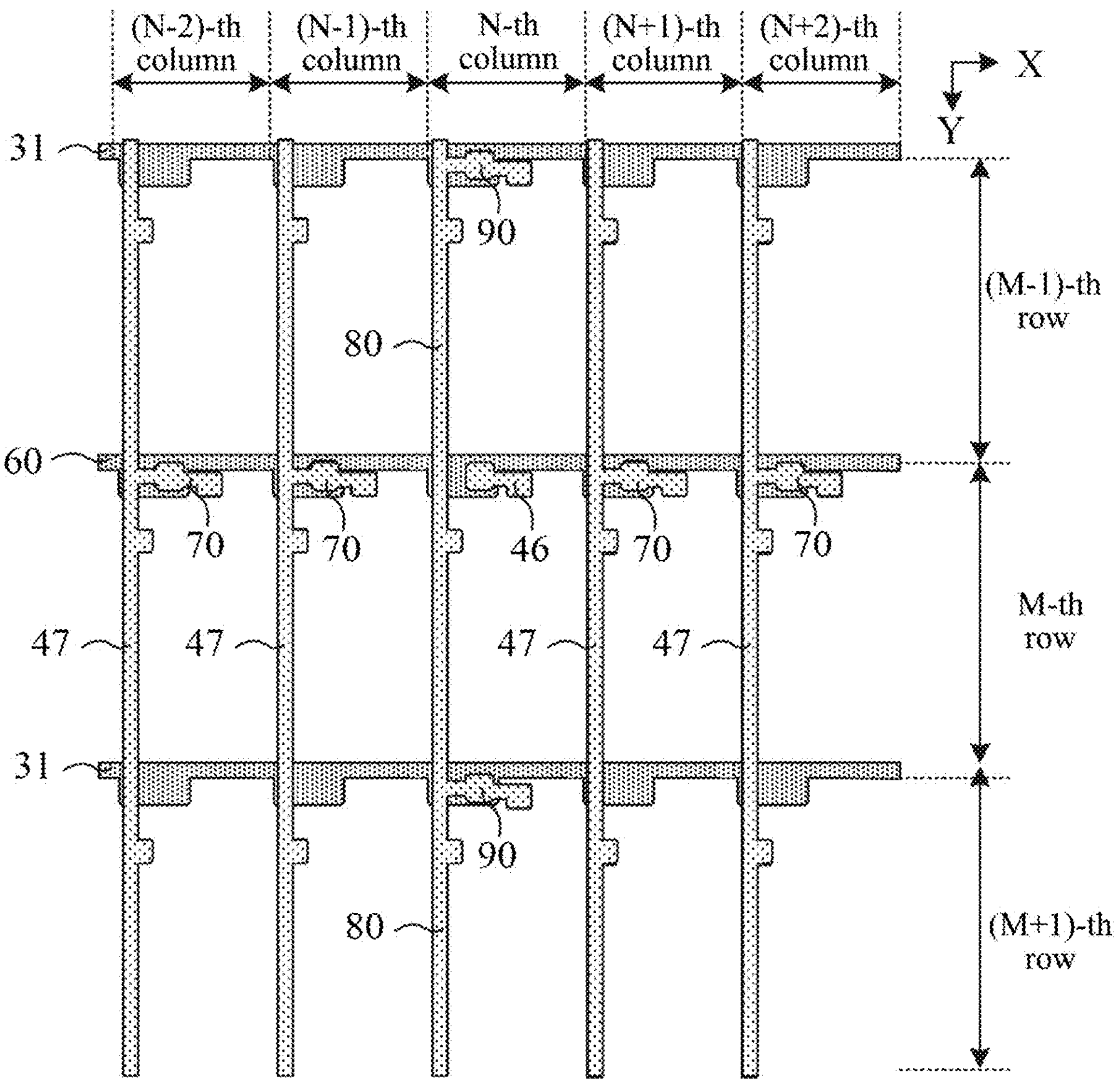
FIG. 19 is a schematic diagram of an initial signal line with yet another mesh structure according to an exemplary embodiment of the present disclosure.

FIG. 19 is a schematic diagram of an initial signal line with yet another mesh structure in the first circuit region according to an exemplary embodiment of the present disclosure, and an arrangement of circuit units and dummy units is the same as that shown in FIG. 8. As shown in FIG. 19, in an exemplary implementation mode, a second initial signal line 31 may be disposed in a unit row, a first connection line 60 may be disposed in a dummy row, a first initial signal line 47 may be disposed in a unit column, and a second connection line 80 may be disposed in a dummy column.

In an exemplary implementation mode, the first initial electrode 70 may be disposed in at least one dummy unit in the dummy row (except for a dummy unit at intersection of the dummy row and the dummy column), a first end of the first initial electrode 70 is directly connected with the first initial signal line 47 in the dummy unit where the first initial electrode 70 is located, a second end of the first initial electrode 70 is connected with the first connection line 60 in the dummy unit where the first initial electrode 70 is located through a via, a connection between the first initial signal line 47 extending along the second direction Y and the first connection line 60 extending along the first direction X is thus achieved, so that the first initial signal line 47 and the first connection line 60 form a mesh structure for transmitting a first initial signal in a display region.

In an exemplary implementation mode, the second initial electrode 90 may be disposed in at least one dummy unit in the dummy column (except for a dummy unit at intersection of the dummy row and the dummy column), a first end of the second initial electrode 90 is directly connected with the second connection line 80 in the dummy unit where the second initial electrode 90 is located, a second end of the second initial electrode 90 is connected with the second initial signal line 31 in the dummy unit where the second initial electrode 90 is located through a via, a connection between the second initial signal line 31 extending along the first direction X and the second connection line 80 extending along the second direction Y is thus achieved, so that the second initial signal line 31 and the second connection line 80 form a mesh structure for transmitting a second initial signal in a display region.

In an exemplary implementation mode, a sixth connection electrode 46 is provided in the dummy unit at the intersection of the dummy row and the dummy column, and a structure of the circuit unit in this exemplary embodiment may be substantially the same as that in the foregoing embodiment.

In an exemplary implementation mode, the preparation process of the display substrate according to this exemplary embodiment may include following acts.

(31) Forming a pattern of a semiconductor layer, a pattern of a first conductive layer, a pattern of a second conductive layer, and a pattern of a fourth insulation layer, a preparation process and formed conductive patterns are substantially the same as those in the acts (11) to (14) of the foregoing embodiment, and will not be repeated here.

Figure 20:
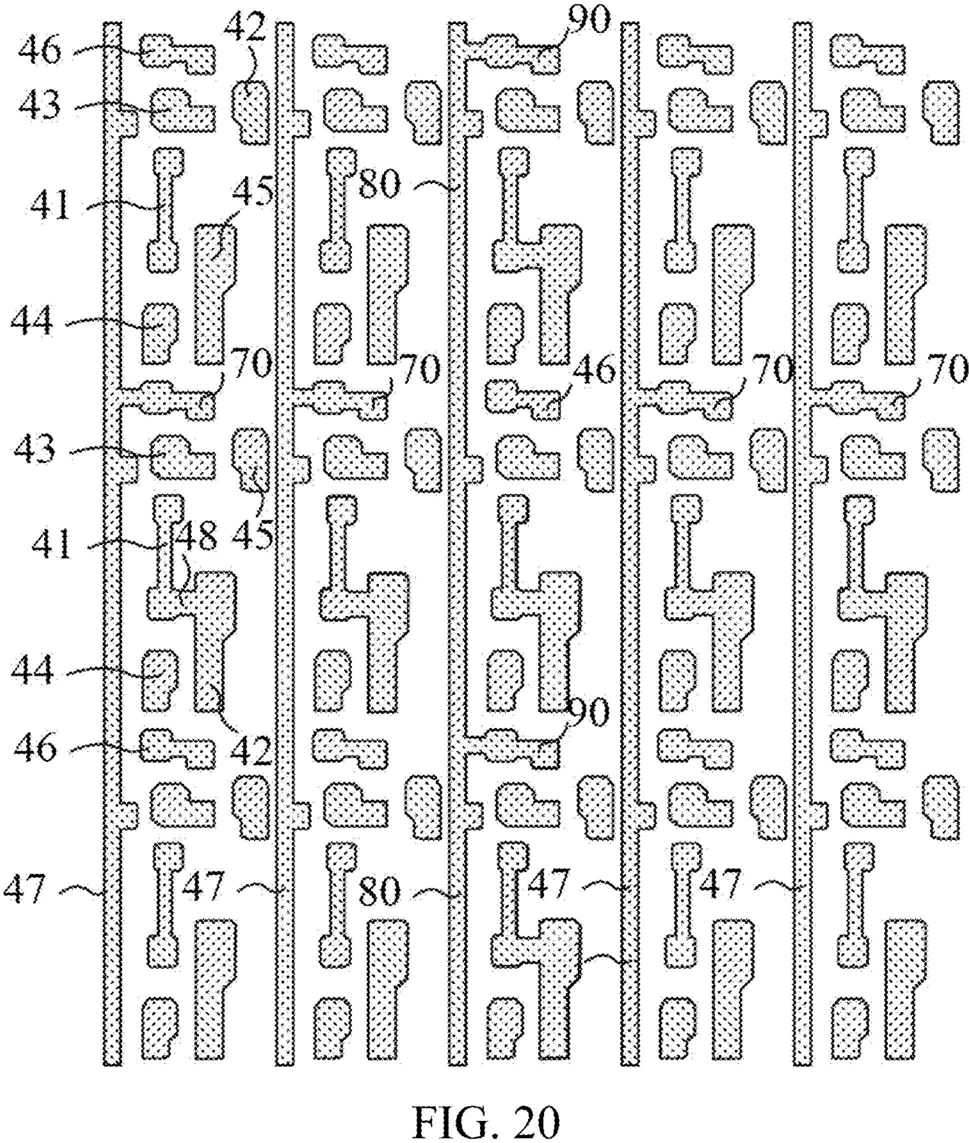
FIG. 20 is a schematic diagram of a display substrate after yet another pattern of a third conductive layer is formed according to the present disclosure.

(32) Forming a pattern of a third conductive layer, the pattern of the third conductive layer is substantially the same as the pattern of the third conductive layer formed in the act (15) of the foregoing embodiment, a difference is that a third conductive layer of a dummy units in an M-th row (except for an N-th column) may include a first initial signal line 47 and a first initial electrode 70, a third conductive layer of a dummy units in the N-th column (except for the M-th row) may include a second connection line 80 and a second initial electrode 90, and third conductive layers of dummy units in the M-th row and the N-th column may include a second connection line 80 and a sixth connection electrode 46, as shown in FIG. 20.

In an exemplary implementation mode, in at least one dummy unit in an M-th row (except for a dummy unit located in an N-th column), a first end of a first initial electrode 70 is connected with a first initial signal line 47, after a second end of the first initial electrode 70 extends along the first direction X, it is connected with a connection block through a ninth via on one hand, on the other hand, it is connected with a first region of a seventh active layer through a seventh via, a connection between the first initial signal line 47 extending along the second direction Y and the first connection line 60 extending along the first direction X is thus achieved, so that the first initial signal line 47 and the first connection line 60 form a mesh structure for transmitting a first initial signal in a display region.

In an exemplary implementation mode, in at least one dummy unit in an N-th column (except for a dummy unit located in an M-th row), a first end of a second initial electrode 90 is connected with a second connection line 80, after a second end of the second initial electrode 90 extends along the first direction X, it is connected with a connection block through a ninth via on one hand, on the other hand, it is connected with a first region of a seventh active layer through a seventh via, a connection between a second initial signal line 31 extending along the first direction X and the second connection line 80 extending along the second direction Y is thus achieved, so that the second initial signal line 31 and the second connection line 80 form a mesh structure for transmitting a second initial signal in a display region.

In an exemplary implementation mode, in dummy units in an M-th row and an N-th column, a sixth connection electrode 46 is connected with a connection block through a ninth via on one hand, and on the other hand, it is connected with a first region of a seventh active layer through a seventh via, that is, the sixth connection electrode 46 in the dummy units in the M-th row and the N-th column is only connected with a first connection line 60, but is not connected with a second connection line 80.

(33) Forming a pattern of a first planarization layer and a pattern of a fourth conductive layer, a preparation process and formed patterns are substantially the same as those in the acts (16) to (17) of the foregoing embodiment, and will not be repeated here.

In the display substrate provided by the exemplary embodiment of the present disclosure, on one hand, it is set that a first connection line of which a main body portion extends along a first direction in a dummy row, the first connection line is connected with a first initial signal line of which a main body portion extends along a second direction, so that an initial signal line transmitting a first initial signal forms a mesh structure, on the other hand, it is set that a second connection line of which a main body portion extends along the second direction in a dummy column, the second connection line is connected with a second initial signal line of which a main body portion extends along the first direction, so that an initial signal line transmitting a second initial signal forms a mesh structure, a mesh layout of the initial signal line transmitting the first initial signal and the initial signal line transmitting the second initial signal is achieved simultaneously, not only resistances of the first initial signal line and the second initial signal line are effectively reduced, voltage drops of a first initial voltage and a second initial voltage are reduced, but also uniformity of the first initial voltage and the second initial voltage in the display substrate is effectively improved, display uniformity is effectively improved, and display character and display quality are improved.

In the present disclosure, it is set that an orthographic projection of an anode connection electrode on a base substrate is at least partially overlapped with an orthographic projection of the first initial signal line on the base substrate, an influence of the anode connection electrode on a potential of a key node of a pixel drive circuit may be avoided, which is beneficial to improvement of display uniformity.

In the present disclosure, a shielding electrode is provided, and an orthographic projection of the shielding electrode on a base substrate is at least partially overlapped with an orthographic projection of a second node N2 of a pixel drive circuit on the base substrate, not only a corresponding signal may be prevented from affecting a potential of a key node of the pixel drive circuit, but also a difference in parasitic capacitances of regions where second nodes N2 are located in different circuit units may be eliminated, thereby improving display uniformity and a display effect.

In the present disclosure, a first initial signal line vertically penetrating through a display region is provided, so that a first initial signal from a bonding region may be quickly transmitted to the display region, which improves an initialization speed, which is more conducive to improving a refresh rate, and meets a high-frequency requirement.

The preparation process in the present disclosure may be compatible well with an existing preparation process, which is simple in process implementation, easy to implement, high in production efficiency, low in production cost, and high in yield.

The structure shown above and the preparation process thereof in the present disclosure are merely exemplary description. In an exemplary implementation mode, corresponding structures may be changed and patterning processes may be added or reduced according to actual needs, which is not limited here in the present disclosure.

The display substrate of the present disclosure may be applied to another display apparatus having a pixel drive circuit, which is not limited here in the present disclosure.

The present disclosure further provides a preparation method of a display substrate, for preparing the display substrate according to the foregoing embodiments. In an exemplary implementation mode, the display substrate may include a display region, a bonding region disposed on a side of the display region, and a bezel region disposed on another side of the display region, the display region may include: multiple circuit units constituting multiple unit rows and multiple unit columns, and multiple dummy units constituting at least one dummy row and/or at least one dummy column, the dummy row includes multiple dummy units sequentially arranged along a first direction, the dummy column includes multiple dummy units sequentially arranged along a second direction, the first direction intersects with the second direction; the preparation method may include following acts.

A first initial signal line extending along the second direction is formed in at least one unit column, a first connection line extending along the first direction is formed in at least one dummy row, and the first initial signal line is connected with the first connection line to form a mesh structure for transmitting a first initial signal; and/or, a second initial signal line extending along the first direction is formed in at least one unit row, and a second connection line extending along the second direction is formed in at least one dummy column, the second initial signal line is connected with the second connection line to form a mesh structure for transmitting a second initial signal.

The present disclosure further provides a display apparatus which includes the aforementioned display substrate. The display apparatus may be any product or component with a display function, such as a mobile phone, a tablet computer, a television, a display, a laptop computer, a digital photo frame, and a navigator, and the embodiments of the present disclosure are not limited thereto.

Although implementation modes disclosed in the present disclosure are described as above, the described contents are only implementation modes which are used for facilitating understanding of the present disclosure, but are not intended to limit the present disclosure. Any skilled person in the art to which the present disclosure pertains may make any modification and variation in forms and details of implementation without departing from the spirit and scope of the present disclosure. However, the scope of patent protection of the present disclosure should be subject to the scope defined in the appended claims.

The invention claimed is:

1. A display substrate, comprising a display region, a bonding region disposed on a side of the display region, and a bezel region disposed on another side of the display region, wherein the display region comprises: multiple circuit units constituting multiple unit rows and multiple unit columns, and multiple dummy units constituting at least one dummy row and at least one dummy column, the dummy row comprises multiple dummy units sequentially arranged along a first direction, the dummy column comprises multiple dummy units sequentially arranged along a second direction, the first direction intersects with the second direction; at least one unit column is provided with a first initial signal line extending along the second direction, and at least one dummy row is provided with a first connection line extending along the first direction, the first initial signal line is connected with the first connection line to form a mesh structure for transmitting a first initial signal; and at least one unit row is provided with a second initial signal line extending along the first direction, and at least one dummy column is provided with a second connection line extending along the second direction, and the second initial signal line is connected with the second connection line to form a mesh structure for transmitting a second initial signal;

wherein at least one circuit unit of the multiple circuit units comprises a pixel drive circuit, the pixel drive circuit at least comprises multiple transistors;

wherein the multiple transistors comprise a first transistor, a third transistor, and a seventh transistor;

wherein a first electrode of the first transistor is connected with the first initial signal line, and a second electrode of the first transistor is connected with a second node; the first transistor is configured to transmit a first initial voltage to a control electrode of the third transistor to initialize a charge amount of the control electrode of the third transistor;

wherein the control electrode of the third transistor is connected with the second node; a first electrode of the third transistor is connected with a first node, and a second electrode of the third transistor is connected with a third node; the third transistor is configured to determine an amount of a drive current flowing between a first power supply line and a second power supply line according to a potential difference between the control electrode of the third transistor and the first electrode of the third transistor; and wherein a first electrode of the seventh transistor is connected with the second initial signal line, and a second electrode of the seventh transistor is connected with a first electrode of a light emitting device; the seventh transistor is configured to transmit a second initial voltage to the first electrode of the light emitting device to initialize a charge amount accumulated in the first electrode of the light emitting device or release the charge amount accumulated in the first electrode of the light emitting device.

2. The display substrate according to claim 1, wherein at least one dummy unit in the dummy row comprises a first initial electrode, a first end of the first initial electrode is connected with the first initial signal line, and a second end of the first initial electrode is connected with the first connection line.

3. The display substrate according to claim 2, wherein the pixel drive circuit further comprises a storage capacitor; in a plane perpendicular to the display substrate, the display substrate comprises a semiconductor layer, a first conductive layer, a second conductive layer, and a third conductive layer sequentially arranged on a base substrate, the semiconductor layer at least comprises active layers of the multiple transistors, the first conductive layer at least comprises a first electrode plate of the storage capacitor and gate electrodes of the multiple transistors, the second conductive layer at least comprises a second electrode plate of the storage capacitor and the second initial signal line, and the third conductive layer at least comprises the first initial signal line and first electrodes and second electrodes of the multiple transistors.

4. The display substrate according to claim 1, wherein at least one dummy unit in the dummy column comprises a second initial electrode, a first end of the second initial electrode is connected with the second connection line, and a second end of the second initial electrode is connected with the second initial signal line.

5. The display substrate according to claim 1, wherein at least one dummy unit in the dummy row comprises a first initial electrode, a first end of the first initial electrode is connected with the first initial signal line, and a second end of the first initial electrode is connected with the first connection line; at least one dummy unit in the dummy column comprises a second initial electrode, a first end of the second initial electrode is connected with the second connection line, and a second end of the second initial electrode is connected with the second initial signal line.

6. The display substrate according to claim 1, wherein the pixel drive circuit further comprises a storage capacitor; in a plane perpendicular to the display substrate, the display substrate comprises a semiconductor layer, a first conductive layer, a second conductive layer, and a third conductive layer sequentially arranged on a base substrate, the semiconductor layer at least comprises active layers of the multiple transistors, the first conductive layer at least comprises a first electrode plate of the storage capacitor and gate electrodes of the multiple transistors, the second conductive layer at least comprises a second electrode plate of the storage capacitor and the second initial signal line, and the third conductive layer at least comprises the first initial signal line and first electrodes and second electrodes of the multiple transistors.

7. The display substrate according to claim 6, wherein the second conductive layer further comprises the first connection line, the third conductive layer further comprises a first initial electrode, a first end of the first initial electrode is connected with the first initial signal line, and a second end of the first initial electrode is connected with the first connection line through a via.

8. The display substrate according to claim 6, wherein the third conductive layer further comprises a second initial electrode and the second connection line, a first end of the second initial electrode is connected with the second connection line, and a second end of the second initial electrode is connected with the second initial signal line through a via.

9. The display substrate according to claim 6, wherein the second conductive layer further comprises the first connection line, the third conductive layer further comprises a first initial electrode, a second initial electrode, and the second connection line, a first end of the first initial electrode is connected with the first initial signal line, a second end of the first initial electrode is connected with the first connection line through a via, a first end of the second initial electrode is connected with the second connection line, and a second end of the second initial electrode is connected with the second initial signal line through a via.

10. The display substrate according to claim 6, wherein the multiple transistors further comprise a second transistor, a fourth transistor, a fifth transistor, and a sixth transistor; a first electrode of the fourth transistor is connected with a data signal line, a first electrode of the fifth transistor is connected with the first power supply line, the second electrode of the first transistor is connected with a first electrode of the second transistor and a gate electrode of the third transistor, a second electrode of the second transistor is connected with the second electrode of the third transistor and a first electrode of the sixth transistor, the first electrode of the third transistor is connected with a second electrode of the fourth transistor and a second electrode of the fifth transistor, and a second electrode of the sixth transistor is connected with the second electrode of the seventh transistor.

11. The display substrate according to claim 10, wherein the pixel drive circuit further comprises an anode connection electrode, the anode connection electrode is connected with the second electrode of the sixth transistor and the second electrode of the seventh transistor respectively, and an orthographic projection of the anode connection electrode on the base substrate is at least partially overlapped with an orthographic projection of the first initial signal line on the base substrate.

12. The display substrate according to claim 11, wherein the anode connection electrode comprises a first electrode, a second electrode, and a third electrode, a first end of the first electrode is connected with the second electrode of the sixth transistor through a via, after a second end of the first electrode extends along an opposite direction of the first direction, the second end of the first electrode is connected with a first end of the second electrode, after a second end of the second electrode extends along an opposite direction of the second direction, the second end of the second electrode is connected with a first end of the third electrode, after a second end of the third electrode extends along the first direction, the second end of the third electrode is connected with the second electrode of the seventh transistor through a via, and an orthographic projection of the second electrode on the base substrate is at least partially overlapped with the orthographic projection of the first initial signal line on the base substrate.

13. The display substrate according to claim 10, wherein the pixel drive circuit further comprises a shielding electrode, the shielding electrode is connected with the first power supply line, and an orthographic projection of the shielding electrode on the base substrate is at least partially overlapped with an orthographic projection of the second electrode of the first transistor on the base substrate.

14. The display substrate according to claim 10, wherein at least one dummy unit comprises a dummy drive circuit, the dummy drive circuit at least comprises a storage capacitor and the first transistor to the seventh transistor, the storage capacitor comprises a first electrode plate and a second electrode plate, an orthographic projection of the first electrode plate on the base substrate is at least partially overlapped with an orthographic projection of the second electrode plate on the base substrate, and the first electrode plate of the dummy drive circuit and the second electrode plate of the dummy drive circuit are both connected with the first power supply line.

15. The display substrate according to claim 14, wherein an active layer of the first transistor in the dummy drive circuit lacks a channel region and an active layer of the seventh transistor in the dummy drive circuit lacks a channel region.

16. The display substrate according to claim 1, wherein the display region at least comprises a first circuit region, a second circuit region, and a third circuit region; the first circuit region comprises multiple unit rows, multiple unit columns, at least one dummy row, and at least one dummy column, the second circuit region is disposed between the first circuit region and the bezel region, the second circuit region comprises a gate drive circuit, multiple unit rows, multiple unit columns, and at least one dummy row, the third circuit region is disposed between the first circuit region and the bonding region, and the third circuit region comprises a data fan-out line, multiple unit rows, multiple unit columns, and at least one dummy column.

17. The display substrate according to claim 16, wherein at least one dummy unit in the dummy row at least comprises a dummy drive circuit, the dummy drive circuit is connected with a first scan signal line, a second scan signal line, and a light emitting control line, the first scan signal line, the second scan signal line, and the light emitting control line in the dummy row extend to the bezel region along the first direction and are connected with a bezel power supply lead line in the bezel region, and the bezel power supply lead line is configured to transmit a high voltage power supply signal or a low voltage power supply signal.

18. The display substrate according to claim 16, wherein at least one dummy unit in the dummy column at least comprises a dummy drive circuit, the dummy drive circuit is connected with a data signal line, the data signal line in the dummy column extends to the bonding region along the second direction, and the data signal line is connected with a bonding power supply lead line in the bonding region, and the bonding power supply lead line is configured to transmit a high voltage power supply signal or a low voltage power supply signal.

19. A display apparatus, comprising the display substrate according to claim 1.

20. A preparation method of a display substrate, wherein the display substrate comprises a display region, a bonding region disposed on a side of the display region, and a bezel region disposed on another side of the display region, the display region comprises: multiple circuit units forming multiple unit rows and multiple unit columns, and multiple dummy units forming at least one dummy row and at least one dummy column, the dummy row comprises multiple dummy units sequentially arranged along a first direction, the dummy column comprises multiple dummy units sequentially arranged along a second direction, the first direction intersects with the second direction; the preparation method comprises:

forming a first initial signal line extending along the second direction in at least one unit column, forming a first connection line extending along the first direction in at least one dummy row, wherein the first initial signal line is connected with the first connection line to form a mesh structure for transmitting a first initial signal; and, forming a second initial signal line extending along the first direction in at least one unit row, forming a second connection line extending along the second direction in at least one dummy column, wherein the second initial signal line is connected with the second connection line to form a mesh structure for transmitting a second initial signal, wherein at least one circuit unit of the multiple circuit units comprises a pixel drive circuit, the pixel drive circuit at least comprises multiple transistors;

wherein the multiple transistors comprise a first transistor, a third transistor, and a seventh transistor;

wherein a first electrode of the first transistor is connected with the first initial signal line, and a second electrode of the first transistor is connected with a second node; the first transistor is configured to transmit a first initial voltage to a control electrode of the third transistor to initialize a charge amount of the control electrode of the third transistor;

wherein the control electrode of the third transistor is connected with the second node; a first electrode of the third transistor is connected with a first node, and a second electrode of the third transistor is connected with a third node; the third transistor is configured to determine an amount of a drive current flowing between a first power supply line and a second power supply line according to a potential difference between the control electrode of the third transistor and the first electrode of the third transistor; and wherein a first electrode of the seventh transistor is connected with the second initial signal line, and a second electrode of the seventh transistor is connected with a first electrode of a light emitting device; the seventh transistor is configured to transmit a second initial voltage to the first electrode of the light emitting device to initialize a charge amount accumulated in the first electrode of the light emitting device or release the charge amount accumulated in the first electrode of the light emitting device.

* * * * *